US011354468B2

(12) United States Patent
Wyrwas et al.

(10) Patent No.: US 11,354,468 B2
(45) Date of Patent: **\*Jun. 7, 2022**

(54) GENERATING AUTONOMOUS VEHICLE SIMULATION DATA FROM LOGGED DATA

(71) Applicant: Aurora Operations, Inc., Mountain View, CA (US)

(72) Inventors: John Michael Wyrwas, Cupertino, CA (US); Jessica Elizabeth Smith, Pittsburgh, PA (US); Simon Box, San Francisco, CA (US)

(73) Assignee: AURORA OPERATIONS, INC., Mountain View, CA (US)

( \* ) Notice: Subject to any disclaimer, the term of this patent is extended or adjusted under 35 U.S.C. 154(b) by 0 days.

This patent is subject to a terminal disclaimer.

(21) Appl. No.: 17/483,506

(22) Filed: Sep. 23, 2021

(65) Prior Publication Data

US 2022/0012388 A1    Jan. 13, 2022

Related U.S. Application Data

(63) Continuation of application No. 17/186,577, filed on Feb. 26, 2021, now Pat. No. 11,200,359, which is a
(Continued)

(51) Int. Cl.
*G06F 30/27*    (2020.01)
*G06F 30/15*    (2020.01)
(Continued)

(52) U.S. Cl.
CPC .............. *G06F 30/27* (2020.01); *G06F 30/15* (2020.01); *G06K 9/6259* (2013.01);
(Continued)

(58) Field of Classification Search
CPC ....... G06F 30/27; G06F 30/15; G06K 9/6259; G06K 9/6264; G07C 5/008; G07C 5/0841;
(Continued)

(56) References Cited

U.S. PATENT DOCUMENTS 7,827,011 B2    11/2010    DeVaul et al.
8,036,842 B2    10/2011    DeVaul et al.
(Continued)

FOREIGN PATENT DOCUMENTS

WO    2019199880 A1    10/2019

OTHER PUBLICATIONS

International Search Report and Written Opinion for PCT/US2021/021878, dated Jun. 22, 2021, 15 pgs.
(Continued)

*Primary Examiner* — Yonel Beaulieu
(74) *Attorney, Agent, or Firm* — Patent Law Works LLP

(57) ABSTRACT

Logged data from an autonomous vehicle is processed to generate augmented data. The augmented data describes an actor in an environment of the autonomous vehicle, the actor having an associated actor type and an actor motion behavior characteristic. The augmented data may be varied to create different sets of augmented data. The sets of augmented data can be used to create one or more simulation scenarios that in turn are used to produce machine learning models to control the operation of autonomous vehicles.

20 Claims, 23 Drawing Sheets

Related U.S. Application Data continuation of application No. 17/119,214, filed on Dec. 11, 2020.

(60) Provisional application No. 62/988,303, filed on Mar. 11, 2020.

(51) Int. Cl.
| | |
|---|---|
| *G06K 9/00* | (2022.01) |
| *G07C 5/08* | (2006.01) |
| *G05D 1/00* | (2006.01) |
| *G06K 9/62* | (2022.01) |
| *G07C 5/00* | (2006.01) |
| *G05D 1/02* | (2020.01) |

(52) U.S. Cl.
CPC ........... *G06K 9/6264* (2013.01); *G07C 5/008* (2013.01); *G07C 5/0841* (2013.01); *G05D 1/0088* (2013.01); *G05D 1/0221* (2013.01)

(58) Field of Classification Search
CPC ... G07C 5/00; G07C 5/02; G07C 5/08; G05D 1/0088; G05D 1/0221; G05D 1/00
See application file for complete search history.

(56) References Cited

U.S. PATENT DOCUMENTS

| | | | |
|---|---|---|---|
| 9,720,415 B2 | 8/2017 | Levinson et al. | |
| 9,836,895 B1* | 12/2017 | Nygaard | G07C 5/0841 |
| 10,185,999 B1 | 1/2019 | Konrardy | |
| 10,255,168 B2 | 4/2019 | Stefan et al. | |
| 10,831,202 B1 | 11/2020 | Askeland et al. | |
| 10,852,721 B1 | 12/2020 | Smith et al. | |
| 10,915,762 B1* | 2/2021 | Russell | G06K 9/00798 |
| 11,086,319 B2* | 8/2021 | Valois | G05D 1/0278 |
| 11,087,477 B2* | 8/2021 | Choi | G06N 3/08 |
| 2017/0371348 A1* | 12/2017 | Mou | G01S 17/86 |
| 2018/0123428 A1 | 5/2018 | Sturm et al. | |
| 2018/0136644 A1 | 5/2018 | Levinson et al. | |
| 2018/0275658 A1* | 9/2018 | Iandola | G06K 9/6257 |
| 2019/0129436 A1 | 5/2019 | Sun et al. | |
| 2019/0152492 A1* | 5/2019 | el Kaliouby | B60W 30/10 |
| 2019/0303759 A1 | 10/2019 | Farabet et al. | |
| 2020/0005631 A1* | 1/2020 | Visintainer | G06K 9/2018 |
| 2020/0074230 A1 | 3/2020 | Englard et al. | |
| 2020/0097007 A1* | 3/2020 | Dyer | G08G 1/0129 |
| 2020/0125112 A1* | 4/2020 | Mao | G06K 9/6289 |
| 2020/0150665 A1* | 5/2020 | Refaat | B60W 30/0953 |
| 2020/0183387 A1* | 6/2020 | Heit | G06K 9/00791 |
| 2020/0293054 A1* | 9/2020 | George | G06N 20/00 |
| 2021/0018916 A1* | 1/2021 | Thakur | G05D 1/0088 |
| 2021/0103742 A1* | 4/2021 | Adeli-Mosabbeb | G06K 9/00791 |
| 2021/0146919 A1* | 5/2021 | Xu | G08G 1/0116 |
| 2021/0263152 A1* | 8/2021 | Halder | G05D 1/0231 |

OTHER PUBLICATIONS

Queiroz, Rodrigo et al., "GeoScenario: an Open DSL for Autonomous Driving Scenario Representation", 2019 IEEE Intelligent Vehicles Symposium (IV), Jun. 9-12, 2019, 8 pgs.

Product Marketing, "Autonomous Vehicle Modeling & Simulation", https://simulatemore.mscsoftware.com/autonomous-vehicle-modeling-simulation/, Jul. 17, 2018, retrieved Jan. 10, 2020, 7 pgs.

Southward, Charles M. II, "Autonomous Convoy Study of Unmanned Ground Vehicles Using Visual Snakes", Master's Thesis Submitted to the Faculty of the Virginia Polytechnic Institute and State University, May 1, 2007, 78 pgs.

Rosique, Francisca et al., "A Systematic Review of Perception System and Simulators for Autonomous Vehicles Research", Sensors 2019, 19, 648; doi:10.3390/s19030648, Feb. 5, 2019, 29 pgs.

* cited by examiner

GENERATING AUTONOMOUS VEHICLE SIMULATION DATA FROM LOGGED DATA

CROSS-REFERENCE TO RELATED APPLICATIONS

This application is a continuation of U.S. application Ser. No. 17/186,577, filed Feb. 26, 2021, titled "Generating Autonomous Vehicle Simulation Data from Logged Data", which is a continuation of U.S. application Ser. No. 17/119,214, filed Dec. 11, 2020, titled "Generating Autonomous Vehicle Simulation Data from Logged Data", which claims the benefit of U.S. Provisional Application Ser. No. 62/988,303, filed Mar. 11, 2020, titled "Generating Autonomous Vehicle Simulation Data From Logged Data", all of which are hereby incorporated herein by reference in their entirety.

BACKGROUND

A challenge to autonomous vehicle technology arises in acquiring a sufficient quantity and quality of training data to accurately represent a wide variety of driving conditions and scenarios. This training data is used to train the machine learning models used for different systems in the autonomous vehicle, for example, the perception, planning, and control subsystems. One problem is that training of the machine learning models requires a very large amount of data, and just capturing sensor data from operation of autonomous vehicles does not provide enough data. Some approaches have tried to use simulation data for training the machine learning models to address this data quantity issue. For example, some have used simulation data obtained from the execution of simulators that operate similar to video games. However, the problem with that approach is that the data provided by such simulators is not of high enough quality and does not provide an accurate representation of real-world driving conditions.

SUMMARY

This specification relates to methods and systems for generating simulation data from logged data. According to one aspect of the subject matter described in this disclosure, a method includes receiving sensor data from one or more sensors of a vehicle, generating augmented data from the sensor data, the augmented data describing an actor in an environment of the vehicle, generating a variation of the augmented data, and generating a simulation scenario, the simulation scenario generated using the variation of the augmented data.

In general, another aspect of the subject matter described in this disclosure includes a system comprising one or more processors and memory operably coupled with the one or more processors, wherein the memory stores instructions that, in response to execution of the instructions by the one or more processors, cause the one or more processors to perform operations comprising receiving sensor data from a sensor of a vehicle, generating augmented data from the sensor data, the augmented data describing an actor in an environment of the vehicle, generating a variation of the augmented data, and generating a simulation scenario, the simulation scenario generated using the variation of the augmented data.

Other implementations of one or more of these aspects include corresponding systems, apparatus, and computer programs, configured to perform the actions of the methods, encoded on computer storage devices.

These and other implementations may each optionally include one or more of the following features. For instance, the method further comprises executing a simulation based on the simulation scenario to generate a simulated output, providing the simulation scenario as a training input to the machine learning model to generate a predicted output of the machine learning model, and updating the machine learning model based on a difference between the predicted output and the simulated output of the simulation scenario. For instance, features may also include that generating the variation of the augmented data includes changing one or more actor characteristics associated with the actor, that the actor is associated with an actor characteristic, and the actor characteristic includes one from a group of actor velocity, actor type, actor size, actor geometric shape, actor reflectivity, actor color, actor path, lateral offset of motion of the actor, longitudinal offset of motion of the actor, and actor behavior response, that the generating a variation of the augmented data includes deleting the actor, adding an additional actor, or both. For example, the method may also include generating a set of augmented data samples, and wherein the generating the simulation scenario using the variation of the augmented data includes generating the simulation scenario from the set of augmented data samples. In general, other aspects of the subject matter of this disclosure may be implemented in methods where generating the variation of the augmented data includes generating a plurality of sets of augmented data samples, and wherein generating the simulation scenario using the variation of the augmented data includes generating a plurality of simulation scenarios each one corresponding to one set of the plurality of sets of augmented data samples. For instance, the method may also include executing a simulation based on the simulation scenario to generate a simulated output, providing the simulation scenario as a training input to the machine learning model to generate a predicted output of the machine learning model, and updating the machine learning model based on a difference between the predicted output and the simulated output of the simulation scenario. For example, features may also include that the simulation scenario describes motion behavior of a simulated vehicle and at least one simulated actor. Still other implementations include an actor that is one from a group of another vehicle, a bicycle, a scooter, traffic, a pedestrian, an animal, machinery, debris, a static object, and a non-human moveable object.

BRIEF DESCRIPTION OF THE DRAWINGS

These and other aspects and features of the present implementations will become apparent upon review of the following description of specific implementations in conjunction with the accompanying figures, wherein.

DETAILED DESCRIPTION

Implementations of the disclosure are generally related to the use of logged or real sensor data from autonomous vehicles to generate simulation data, such as simulation scenarios. The simulation scenarios can be in turn used to train machine learning models that are used in various subsystems of an autonomous vehicle, for example, the perception, planning, and control subsystems.

Autonomous Vehicle

Figure 1:
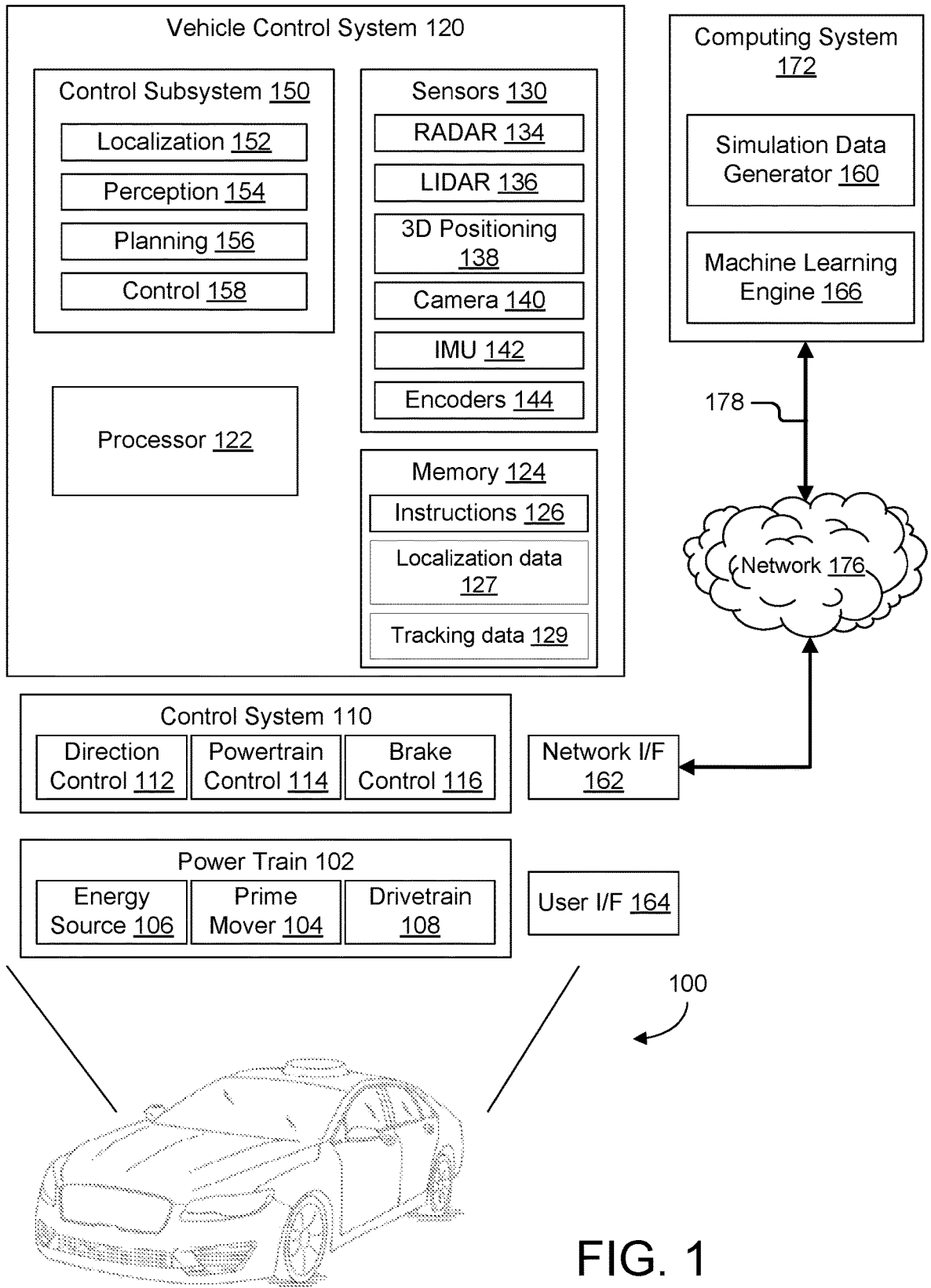
FIG. 1 is a block diagram illustrating an example of a hardware and software environment for an autonomous vehicle according to some implementations.

Referring to the drawings, wherein like numbers denote like parts throughout the several views, FIG. 1 illustrates an example hardware and software environment for an autonomous vehicle within which various techniques disclosed herein may be implemented. The vehicle 100, for example, may include a powertrain 102 including a prime mover 104 powered by an energy source 106 and capable of providing power to a drivetrain 108, as well as a control system 110 including a direction control 112, a powertrain control 114, and a brake control 116. The vehicle 100 may be implemented as any number of different types of vehicles, including vehicles capable of transporting people and/or cargo, and capable of traveling by land, by sea, by air, underground, undersea, and/or in space, and it will be appreciated that the aforementioned components 102-116 may vary widely based upon the type of vehicle within which these components are utilized.

For simplicity, the implementations discussed hereinafter will focus on a wheeled land vehicle such as a car, van, truck, bus, etc. In such implementations, the prime mover 104 may include one or more electric motors and/or an internal combustion engine (among others). The energy source 106 may include, for example, a fuel system (e.g., providing gasoline, diesel, hydrogen, etc.), a battery system, solar panels or other renewable energy source, and/or a fuel cell system. The drivetrain 108 includes wheels and/or tires along with a transmission and/or any other mechanical drive components suitable for converting the output of the prime mover 104 into vehicular motion, as well as one or more brakes configured to controllably stop or slow the vehicle 100 and direction or steering components suitable for controlling the trajectory of the vehicle 100 (e.g., a rack and pinion steering linkage enabling one or more wheels of the vehicle 100 to pivot about a generally vertical axis to vary an angle of the rotational planes of the wheels relative to the longitudinal axis of the vehicle). In some implementations, combinations of powertrains and energy sources may be used (e.g., in the case of electric/gas hybrid vehicles), and in other implementations multiple electric motors (e.g., dedicated to individual wheels or axles) may be used as a prime mover. In the case of a hydrogen fuel cell implementation, the prime mover 104 may include one or more electric motors and the energy source 106 may include a fuel cell system powered by hydrogen fuel.

The direction control 112 may include one or more actuators and/or sensors for controlling and receiving feedback from the direction or steering components to enable the vehicle 100 to follow a desired trajectory. The powertrain control 114 may be configured to control the output of the powertrain 102, e.g., to control the output power of the prime mover 104, to control a gear of a transmission in the drivetrain 108, etc., thereby controlling a speed and/or direction of the vehicle 100. The brake control 116 may be configured to control one or more brakes that slow or stop vehicle 100, e.g., disk or drum brakes coupled to the wheels of the vehicle.

Other vehicle types, including but not limited to airplanes, space vehicles, helicopters, drones, military vehicles, all-terrain or tracked vehicles, ships, submarines, construction equipment etc., will necessarily utilize different powertrains, drivetrains, energy sources, direction controls, powertrain controls and brake controls. Moreover, in some implementations, some of the components can be combined, e.g., where directional control of a vehicle is primarily handled by varying an output of one or more prime movers. Therefore, implementations disclosed herein are not limited to the particular application of the herein-described techniques in an autonomous wheeled land vehicle.

In the illustrated implementation, full or semi-autonomous control over the vehicle 100 is implemented in a vehicle control system 120, which may include one or more processors 122 and one or more memories 124, with each processor 122 configured to execute program code instructions 126 stored in a memory 124. The processors(s) can include, for example, graphics processing unit(s) ("GPU(s)") and/or central processing unit(s) ("CPU(s)").

Sensors 130 may include various sensors suitable for collecting information from a vehicle's surrounding environment for use in controlling the operation of the vehicle 100. For example, sensors 130 can include RADAR sensor 134, LIDAR (Light Detection and Ranging) sensor 136, a 3D positioning sensor 138, e.g., a satellite navigation system such as GPS (Global Positioning System), GLONASS (Globalnaya Navigazionnaya Sputnikovaya Sistema, or Global Navigation Satellite System), BeiDou Navigation Satellite System (BDS), Galileo, Compass, etc. The 3D positioning sensors 138 can be used to determine the location of the vehicle on the Earth using satellite signals. The sensors 130 can optionally include a camera 140 and/or an IMU (inertial measurement unit) 142. The camera 140 can be a monographic or stereographic camera and can record still and/or video images. The IMU 142 can include multiple gyroscopes and accelerometers capable of detecting linear and rotational motion of the vehicle 100 in three directions. One or more encoders 144, such as wheel encoders may be used to monitor the rotation of one or more wheels of vehicle 100.

The outputs of sensors 130 may be provided to a set of control subsystems 150, including, a localization subsystem 152, a perception subsystem 154, a planning subsystem 156, and a control subsystem 158. The localization subsystem 152 is principally responsible for precisely determining the location and orientation (also sometimes referred to as "pose") of the vehicle 100 within its surrounding environment, and generally within some frame of reference. The perception subsystem 154 is principally responsible for detecting, tracking, and/or identifying objects within the environment surrounding vehicle 100. A machine learning model in accordance with some implementations can be utilized in tracking objects. The planning subsystem 156 is principally responsible for planning a trajectory or a path of motion for vehicle 100 over some timeframe given a desired destination as well as the static and moving objects within the environment. A machine learning model in accordance with some implementations can be utilized in planning a vehicle trajectory. The control subsystem 158 is principally responsible for generating suitable control signals for controlling the various controls in the vehicle control system 120 in order to implement the planned trajectory of the vehicle 100. Similarly, a machine learning model can be utilized to generate one or more signals to control the autonomous vehicle 100 to implement the planned trajectory.

It will be appreciated that the collection of components illustrated in FIG. 1 for the vehicle control system 120 is merely one example. Individual sensors may be omitted in some implementations. Additionally, or alternatively, in some implementations, multiple sensors of the same types illustrated in FIG. 1 may be used for redundancy and/or to cover different regions around a vehicle. Moreover, there may additional sensors of other types beyond those described above to provide actual sensor data related to the operation and environment of the wheeled land vehicle. Likewise, different types and/or combinations of control subsystems may be used in other implementations. Further, while subsystems 152-158 are illustrated as being separate from processor 122 and memory 124, it will be appreciated that in some implementations, some or all of the functionality of a subsystem 152-158 may be implemented with program code instructions 126 resident in one or more memories 124 and executed by one or more processors 122, and that these subsystems 152-158 may in some instances be implemented using the same processor(s) and/or memory. Subsystems may be implemented at least in part using various dedicated circuit logic, various processors, various field programmable gate arrays ("FPGA"), various application-specific integrated circuits ("ASIC"), various real time controllers, and the like, as noted above, multiple subsystems may utilize circuitry, processors, sensors, and/or other components. Further, the various components in the vehicle control system 120 may be networked in various manners.

In some implementations, the vehicle 100 may also include a secondary vehicle control system (not illustrated), which may be used as a redundant or backup control system for the vehicle 100. In some implementations, the secondary vehicle control system may be capable of fully operating the autonomous vehicle 100 in the event of an adverse event in the vehicle control system 120, while in other implementations, the secondary vehicle control system may only have limited functionality, e.g., to perform a controlled stop of the vehicle 100 in response to an adverse event detected in the primary vehicle control system 120. In still other implementations, the secondary vehicle control system may be omitted.

In general, an innumerable number of different architectures, including various combinations of software, hardware, circuit logic, sensors, networks, etc. may be used to implement the various components illustrated in FIG. 1. Each processor may be implemented, for example, as a microprocessor and each memory may represent the random access memory ("RAM") devices comprising a main storage, as well as any supplemental levels of memory, e.g., cache memories, non-volatile or backup memories (e.g., programmable or flash memories), read-only memories, etc. In addition, each memory may be considered to include memory storage physically located elsewhere in the vehicle 100, e.g., any cache memory in a processor, as well as any storage capacity used as a virtual memory, e.g., as stored on a mass storage device or another computer controller. One or more processors 122 illustrated in FIG. 1, or entirely separate processors, may be used to implement additional functionality in the vehicle 100 outside of the purposes of autonomous control, e.g., to control entertainment systems, to operate doors, lights, convenience features, etc.

In addition, for additional storage, the vehicle 100 may include one or more mass storage devices, e.g., a removable disk drive, a hard disk drive, a direct access storage device ("DASD"), an optical drive (e.g., a CD drive, a DVD drive, etc.), a solid state storage drive ("SSD"), network attached storage, a storage area network, and/or a tape drive, among others.

Furthermore, the vehicle 100 may include a user interface 164 to enable vehicle 100 to receive a number of inputs from and generate outputs for a user or operator, e.g., one or more displays, touchscreens, voice and/or gesture interfaces, buttons and other tactile controls, etc. Otherwise, user input may be received via another computer or electronic device, e.g., via an app on a mobile device or via a web interface.

Moreover, the vehicle 100 may include one or more network interfaces, e.g., network interface 162, suitable for communicating with one or more networks 176 to permit the communication of information with other computers and electronic devices, including, for example, a central service, such as a cloud service, from which the vehicle 100 receives information including trained machine learning models and other data for use in autonomous control thereof. The one or more networks 176, for example, may be a communication network and include a wide area network ("WAN") such as the Internet, one or more local area networks ("LANs") such as Wi-Fi LANs, mesh networks, etc., and one or more bus subsystems. The one or more networks 176 may optionally utilize one or more standard communication technologies, protocols, and/or inter-process communication techniques. In some implementations, data collected by the one or more sensors 130 can be uploaded to a computing system 172 via the network 176 for additional processing.

In the illustrated implementation, the vehicle 100 may communicate via the network 176 with a computing device 172 for the purposes of implementing various functions described below for generating simulation data and training machine learning models. In some implementations, computing device 172 is a cloud-based computing device. As described below in more detail with reference to FIG. 2, the computing device 172 includes a simulation data generator 160 and a machine learning engine 166. In some implementations not shown in FIG. 1, the simulation data generator 160 may be configured and executed on a combination of the computing system 172 and the vehicle control system 120 of the vehicle 100. For example, the simulation data generator 160 may execute some functionality on the vehicle control system 120 of the vehicle 100 while the simulation data generator 160 executes the remaining functionality on the computing system 172. In other implementations, either the computing system 172 or the vehicle control system 120 of the vehicle 100 alone executes the functionality of the simulation data generator 160. For example, in some implementations, the simulation data generator 160 operates on the computing system 172 to receive logged data from the memory 124 and generate simulation data that can be used to by the machine learning engine 166. The machine learning engine 166, operable on the computing system 172, generates a machine learning model based on the simulation data. The machine learning model is sent from the computing system 172 to vehicle 100 to be used in the appropriate control subsystem 152-158 for use in performing its respective function.

Each processor illustrated in FIG. 1, as well as various additional controllers and subsystems disclosed herein, generally operates under the control of an operating system and executes or otherwise relies upon various computer software applications, components, programs, objects, modules, data structures, etc., as will be described in greater detail below. Moreover, various applications, components, programs, objects, modules, etc. may also execute on one or more processors in another computer (e.g., computing system 172) coupled to vehicle 100 via network 176, e.g., in a distributed, cloud-based, or client-server computing environment, whereby the processing required to implement the functions of a computer program may be allocated to multiple computers and/or services over a network.

In general, the routines executed to implement the various implementations described herein, whether implemented as part of an operating system or a specific application, component, program, object, module or sequence of instructions, or even a subset thereof, will be referred to herein as "program code." Program code typically comprises one or more instructions that are resident at various times in various memory and storage devices, and that, when read and executed by one or more processors, perform the steps necessary to execute steps or elements embodying the various aspects of the present disclosure. Moreover, while implementations have and hereinafter will be described in the context of fully functioning computers and systems, it will be appreciated that the various implementations described herein are capable of being distributed as a program product in a variety of forms, and that implementations can be implemented regardless of the particular type of computer readable media used to actually carry out the distribution.

Examples of computer readable media include tangible, non-transitory media such as volatile and non-volatile memory devices, floppy and other removable disks, solid state drives, hard disk drives, magnetic tape, and optical disks (e.g., CD-ROMs, DVDs, etc.) among others.

In addition, various program code described hereinafter may be identified based upon the application within which it is implemented in a specific implementation. However, it should be appreciated that any particular program nomenclature that follows is used merely for convenience, and thus the present disclosure should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the present disclosure is not limited to the specific organization and allocation of program functionality described herein.

The example environment illustrated in FIG. 1 is not intended to limit implementations disclosed herein. Indeed, other alternative hardware and/or software environments may be used without departing from the scope of implementations disclosed herein.

Computing System 172

In some implementations, the computing system 172 receives a time-stamped log of vehicle data from the vehicle control system 120. A time stamp can be added to each instance of vehicle data prior to uploading to computing system 172. The logged data may include raw sensor data from any one or more of the sensors 130, state or localization data from localization subsystem 152, state or perception data from perception subsystem 154, state or planning data from the planning subsystem 156 or state or control data from the control subsystem 158. The logged data may optionally include other vehicle sensor data, logged sensor data, environmental data or identification data. In some instances, the logged data is collected using the autonomous vehicle 100 in its autonomous operations. In other instances, the logged data is collected using the autonomous vehicle 100 but when the autonomous vehicle 100 is being driven manually, and at least a subset of its sensors and modules are operating.

As examples, each instance of time-series log sensor data may include information on a location, orientation, and speed of the autonomous vehicle 100. The tracking data for each instance of the time-series logged data may include tracking of objects external to the autonomous vehicle describing their position(s), extent(s), orientation(s), categories, speed(s), and other tracking data or tracking predictions. Information on static objects (e.g., highway signs, road surfaces, etc.) may also be logged. In some implementations, other forms of environmental data may also be logged (e.g., weather conditions, lighting conditions, visibility, etc.)

The logged data may be used as a source of data to aid in generating simulation scenarios. For example, in some implementations, an individual simulation scenario describes aspects of the motion behavior characteristics of the autonomous vehicle 100 (an ego-vehicle) and one or more actors (e.g., other vehicles, static environmental objects, and pedestrians) in an instantiation of a three-dimensional (3D) world within which the autonomous vehicle 100 interacts. In some implementations, an individual simulation may include a variety of simulation scenarios that describe a set of tests of different specific encounters between an autonomous vehicle, its environment, and other moving and non-moving actors (e.g., other vehicles, other autonomous vehicles, pedestrians, animals, machinery like traffic lights, gates, drawbridges, and non-human moveable things like debris, etc.).

Figure 2:
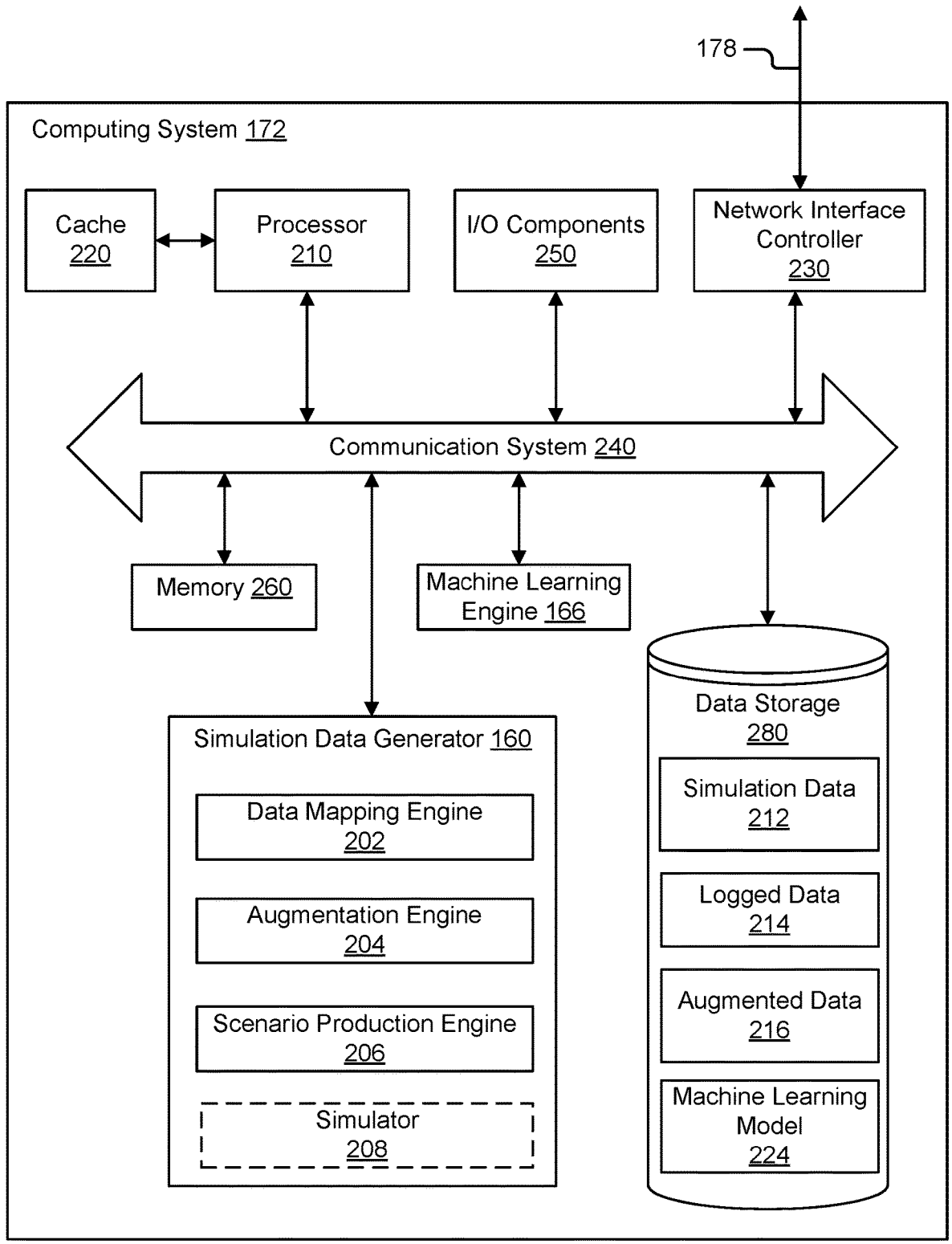
FIG. 2 is a block diagram illustrating a computing system for generating simulation data according to some implementations.

FIG. 2 is a block diagram illustrating an example of the computing system 172 for generating simulation scenarios according to some implementations of this disclosure. More specifically, the simulation data generator 160 is used, for example, to generate a simulation scenario. In some implementations, the machine learning engine 166 may be used, for example, to train a machine learning model 224 using the simulation results of a simulation based on the simulation scenario.

Referring to FIG. 2, the illustrated example computing system 172 includes one or more processors 210 in communication, via a communication system 240 (e.g., bus), with memory 260, at least one network interface controller 230 with network interface port for connection to a network (e.g., network 176 via signal line 178), a data storage 280, other components, e.g., an input/output ("I/O") components interface 250 connecting to a display (not illustrated) and an input device (not illustrated), a machine learning engine 166, and a simulation data generator 160. Generally, the processor(s) 210 will execute instructions (or computer programs) received from memory 260. The processor(s) 210 illustrated incorporate, or are directly connected to, cache memory 220. In some instances, instructions are read from memory 260 into the cache memory 220 and executed by the processor(s) 210 from the cache memory 220.

In more detail, the processor(s) 210 may be any logic circuitry that processes instructions, e.g., instructions fetched from the memory 260 or cache 220. In some implementations, the processor(s) 210 are microprocessor units or special purpose processors. The computing device 172 may be based on any processor, or set of processors, capable of operating as described herein. The processor(s) 210 may be single core or multi-core processor(s). The processor(s) 210 may be multiple distinct processors.

The memory 260 may be any device suitable for storing computer readable data. The memory 260 may be a device with fixed storage or a device for reading removable storage media. Examples include all forms of non-volatile memory, media and memory devices, semiconductor memory devices (e.g., EPROM, EEPROM, SDRAM, and flash memory devices), magnetic disks, magneto optical disks, and optical discs (e.g., CD ROM, DVD-ROM, or Blu-Ray® discs). A computing system 172 may have any number of memory devices as the memory 260. While the simulation data generator 160 and the machine learning engine 166 are illustrated as being separate from processor 210 and memory 260, it will be appreciated that in some implementations, some or all of the functionality of the components 160 and 166 may be implemented with program code instructions resident in the memory 260 and executed by the processor 210.

The cache memory 220 is generally a form of computer memory placed in close proximity to the processor(s) 210 for fast read times. In some implementations, the cache memory 220 is part of, or on the same chip as, the processor(s) 210. In some implementations, there are multiple levels of cache 220, e.g., L2 and L3 cache layers.

The network interface controller 230 manages data exchanges via the network interface (sometimes referred to as network interface ports). The network interface controller 230 handles the physical and data link layers of the OSI model for network communication. In some implementations, some of the network interface controller's tasks are handled by one or more of the processor(s) 210. In some implementations, the network interface controller 230 is part of a processor 210. In some implementations, a computing system 172 has multiple network interfaces controlled by a single controller 230. In some implementations, a computing system 172 has multiple network interface controllers 230. In some implementations, each network interface is a connection point for a physical network link (e.g., a cat-5 Ethernet link). In some implementations, the network interface controller 230 supports wireless network connections and an interface port is a wireless (e.g., radio) receiver/transmitter (e.g., for any of the IEEE 802.11 protocols, near field communication "NFC", Bluetooth, ANT, WiMAX, 5G, or any other wireless protocol). In some implementations, the network interface controller 230 implements one or more network protocols such as Ethernet. Generally, a computing device 172 exchanges data with other computing devices via physical or wireless links (represented by signal line 178) through a network interface. The network interface may link directly to another device or to another device via an intermediary device, e.g., a network device such as a hub, a bridge, a switch, or a router, connecting the computing device 172 to a data network such as the Internet.

The data storage 280 may be a non-transitory storage device that stores data for providing the functionality described herein. The data storage 280 may store, among other data, simulation data 212, logged data 214, augmented data 216, and a machine learning model or representation 224, as will be defined below.

The computing system 172 may include, or provide interfaces 250 for, one or more input or output ("I/O") devices. Input devices include, without limitation, keyboards, microphones, touch screens, foot pedals, sensors, MIDI devices, and pointing devices such as a mouse or trackball. Output devices include, without limitation, video displays, speakers, refreshable Braille terminal, lights, MIDI devices, and 2-D or 3-D printers. Other components may include an I/O interface, external serial device ports, and any additional co-processors. For example, a computing system 172 may include an interface (e.g., a universal serial bus (USB) interface) for connecting input devices, output devices, or additional memory devices (e.g., portable flash drive or external media drive). In some implementations, a computing device 172 includes an additional device such as a co-processor, e.g., a math co-processor can assist the processor 210 with high precision or complex calculations.

Machine Learning Engine 166

In some implementations, the computing system 172 includes a machine learning engine 166 to train a machine learning model 224. As shown in FIG. 2, once the simulation data generator 160 has generated one or more simulation scenarios suitable for training the machine learning model 224, the machine learning engine 166 may train the machine learning model 224 using the simulation scenarios as training examples. In one implementation, the machine learning model 224 is a neural network model and includes a layer and/or layers of memory units where memory units each have corresponding weights. A variety of neural network models can be utilized including feed forward neural networks, convolutional neural networks, recurrent neural networks, radial basis functions, other neural network models, as well as combinations of several neural networks. Additionally, or alternatively, the machine learning model 224 can represent a variety of machine learning techniques in addition to neural networks, for example, support vector machines, decision trees, Bayesian networks, random decision forests, k-nearest neighbors, linear regression, least squares, other machine learning techniques, and/or combinations of machine learning techniques.

One or more machine learning models 224 may be trained for a variety of autonomous vehicle tasks including determining a target autonomous vehicle location, generating one or more signals to control an autonomous vehicle, tracking or identifying objects within the environment of an autonomous vehicle, etc. These tasks can include various perception tasks or motion planning tasks. For example, a neural network model may be trained for perception tasks such as to identify traffic lights in the environment with the autonomous vehicle 100. As a further example, a neural network model may be trained to predict the make and model of other vehicles in the environment with the autonomous vehicle 100. Moreover, a neural network model may be trained for motion planning like to predict or forecast the future trajectory of other actors, predict future binary decisions made by other actors (e.g., will an actor change lanes, or will it yield), or trained to make control decisions for the autonomous vehicle (e.g., should the autonomous vehicle make a lane change or stop at a light or yield). In many implementations, machine learning models may be trained to perform a single task. In other implementations, machine learning models may be trained to perform multiple tasks.

The machine learning engine 166 may generate training instances from the simulation scenarios to train the machine learning model 224. A training instance can include, for example, an instance of simulated autonomous vehicle data where the autonomous vehicle 100 can detect a stop sign using the simulated sensor data from one or more sensors and a label corresponding to a simulated output corresponding to bringing the autonomous vehicle to a stop in the simulation scenario. The machine learning engine 166 may apply a training instance as input to machine learning model 224. In some implementations, the machine learning model 224 may be trained using any one of at least one of supervised learning (e.g., support vector machines, neural networks, logistic regression, linear regression, stacking, gradient boosting, etc.), unsupervised learning (e.g., clustering, neural networks, singular value decomposition, principle component analysis, etc.), or semi-supervised learning (e.g., generative models, transductive support vector machines, etc.). Additionally, or alternatively, machine learning models in accordance with some implementations may be deep learning networks including recurrent neural networks, convolutional neural networks (CNN), networks that are a combination of multiple networks, etc. For example, the machine learning engine 166 may generate a predicted machine learning model output by applying training input to the machine learning model 224. Additionally, or alternatively, the machine learning engine 166 may compare the predicted machine learning model output with a machine learning model known output (e.g., simulated output in the simulation scenario) from the training instance and, using the comparison, update one or more weights in the machine learning model 224. In some implementations, one or more weights may be updated by backpropagating the difference over the entire machine learning model 224.

The machine learning engine 166 may test a trained machine learning model according to some implementations. The machine learning engine 166 may generate testing instances using the simulation scenarios and the simulated autonomous vehicle in the simulation scenario performing the specific autonomous vehicle task for which the machine learning model 224 is trained. The machine learning engine 166 may apply a testing instance as input to the trained machine learning model 224. A predicted output generated by applying a testing instance to the trained machine learning model 224 may be compared with a known output for the testing instance (i.e., a simulated output observed in the simulation) to update an accuracy value (e.g., an accuracy percentage) for the machine learning model 224.

Simulation Data Generator 160

In some implementations, the simulation data generator 160 converts the logged data accessible in the logged data 214 of the data storage 280 in different ways to generate simulation data 212. For example, the logged data is used as a source of data that is based on ground level truth about real world driving situations to generate simulation data stored in simulation data 212 of the data storage 280. In many implementations, the simulation data 212 represents an editable source of truth defining a number of simulation scenarios. The simulation data may, for example, be used in simulations of a perception subsystem or a planning model. However, more generally, the simulation data 212 could be used for other purposes, such as procedural scene generation as one example. In some implementations, one or more components of an instance of the logged data 214 are used to aid in creating at least one aspect of a simulation scenario. For example, in some implementations, the logged data 214 is used as an aid to generate a description including a behavior, vehicle configuration (e.g., autonomous vehicle location, platform, speed, or orientation), and sensor configuration of autonomous vehicle (e.g., ego vehicle) and the environment including actors (e.g., other vehicles, traffic, pedestrians, and static objects) in a simulation scenario. However, more generally, in some implementations, other information available from the logged data 214 may be used as an aid in generating a simulation scenario. The logged data 214 may be generally used, in some implementations, as a resource to provide a source of real sensor data for a simulation task that requires a source of real sensor data.

In some implementations, the simulation data 212 is used run simulations that, in turn, are used to generate training data for the machine learning engine 166. In some implementations, the trained machine learning model 224 may be used in the autonomous vehicle 100 for performing various autonomous vehicle tasks relating to perception, planning, and control, among other things.

An appropriate dataset of quality training data is needed to learn autonomous vehicle tasks. For example, autonomous vehicle tasks may include control signals indicating a route change action, a planning action, and/or other autonomous vehicle actions which are generated in response to data collected from one or more autonomous vehicle sensors. Waiting for real world sensor data to be gathered for use as training data for autonomous vehicle tasks may take extended periods of time (e.g., months, years, etc.). Additionally, other sources of training data, such as video game engines or video/film data, typically don't provide training data that is realistic.

Generating simulation scenarios based on logged data 214 has an advantage in that the simulation scenarios may be highly realistic because they are based off of logged data 214. Additionally, as described below in more detail, many variations on the simulation scenarios may be generated to increase the variety and quantity of training data. The simulation scenarios generated from logged data 214 may generally be used to simulate an encounter between the autonomous vehicle 100, its surrounding environment, and other entities (i.e., other actors) in the surrounding environment. In some implementations, the logged data 214 may be used to generate variations in simulation scenarios. In some implementations, the variations in the simulation scenarios are generated algorithmically. For example, the process starts with a scenario, changes the types of actors, adding/subtracting them, and using different parameters for models that control the actors. The variations of the simulation scenarios can also be generated algorithmically by varying geometry of the world, traffic lights, paint, geometric models of the models, their light, any other properties of the autonomous vehicle's environment. The simulation scenarios may provide a dataset that includes information to instantiate a three-dimensional world that mimics the motion behavior and sensor configuration of the autonomous vehicle 100, other vehicles (autonomous and/or non-autonomous), and pedestrians, among other things.

In implementations consistent with the disclosure, the simulation data generator 160 may include: a data mapping engine 202, an augmentation engine 204 that generates augmented data 216, a scenario production engine 206, and optionally a simulator 208. The data mapping engine 202, the augmentation engine 204, the scenario production engine 206 and the simulator 208 in the simulation data generator 160 are example components in which techniques described herein may be implemented and/or with which other systems, components, and techniques described herein may interface. The operations performed by one or more engines 202, 204, 206, and the simulator 208 of FIG. 2 may be distributed across multiple computing systems. In some implementations, one or more aspects of engines 202, 204, 206, and may be combined into a single system and/or one or more aspects may be implemented by the computing system 172. Engines in accordance with many implementations may each be implemented in one or more computing devices that communicate, for example, through the communication network 176. It should be noted that the simulator 208 is illustrated with dashed lines to indicate that is an optional component of the simulation data generator 160, and in other implementations it may coupled for communication with the simulation data generator 160 via the communication system 240 or may be part of another computing system (not shown) entirely and coupled for communication via signal line 178 and the network controller 230.

The data mapping engine 202 may access and process the logged data 214 and perform one or more operations to map the logged data 214 into an initial form that identifies actors, actor types, and actor motion behavior characteristics (e.g., actor trajectories, including actor speed). For example, in some implementations, the logged data 214 includes perception data from a perception subsystem 154 that includes tracks or tracking data that are predictions on directions, shapes, speeds, sizes, and types of tracked objects. The logged data 214 may also include an output of a localization subsystem 152, describing location information for the ego-vehicle.

In some implementations, the data mapping engine 202 maps a time-series sequence of instances of the logged data 214 to a global coordinate system. Optional smoothing of the mapped time-series data may be performed in some implementations to reduce noise. The identified actors may be fit to a movement model to estimate their movement. In some implementations, smoothing is performed from simulations data.

In some implementations, the tracking data includes a track ID for each tracked object e.g., a unique ID for a tracked object). The tracking data may, for example, include a track ID, size, type, and bounding box. In some implementations, the data mapping engine 202 identifies actors by determining whether or not a track with an ID that occurs over a sequence of instances of logged data is a unique actor. For example, criteria for determining that a sequence of instances of a track ID is a unique actor may include rules on a minimum number of instances that the track with a particular ID occurs, rules based on a consistency with the track ID repeats in a sequence, etc.

In some implementations, the identified actors are fit to a movement model to estimate their movement. The mapping may include one or more rules to generate an output that identifies a set of actors (e.g., vehicles, pedestrians, and static objects) and actor states. The actor states include actor motion behavior characteristics, for example, an orientation; speed, location in the global coordinate system, pose, and derivatives of the actor (e.g., acceleration). The actor motion behavior characteristics correspond to a trajectory traversed by the actor in an environment about an autonomous vehicle (the ego-vehicle).

Each actor has an associated actor type (e.g., an actor type corresponds to an object type, such as pedestrians; different types of vehicles such as cars, trucks, motorcycles, bicycles; and may also optionally in some implementations include static environmental objects). Each actor has various properties that may be varied including geometric shape, color, reflectivity, size, orientations, and any other specific perception properties of actors. The actor type may also be considered to be an actor state, in that in some implementations the actor type may be changed, as discussed below in more detail. The output of the mapping may also, in some implementations, identify an ego-vehicle state describing the motion of the ego-vehicle, which in some implementation may include the location, pose, and speed of the ego-vehicle in the global coordinate system.

The augmentation engine 204 samples the actor states and the ego-vehicle state and generates augmented data. In some implementations, the augmentation engine 204 manipulates the identified actors and actor states (e.g., actor types, and actor motion behavior characteristics, such as the trajectory) to generate variations. The process of manipulating or modifying the actor information may also be called mutation. In some implementations, the output of the augmented engine 204 includes a set of actors, actor types, and associated actor motion behavior characteristics that may have one or more attributes varied in comparison with the original set of actors, actor types, and associated actor motion behavior characteristics. In some implementations, the augmentation engine 204 may be implemented to generate specific mutations in response to configurable input criteria. Other possibilities include generating a wide range of mutations and outputting specific mutations that correspond to configurable input criteria. Some examples of manipulations that may be performed by the augmentation engine 202 include changing a speed or acceleration of an actor, changing the actor type or size, changing an offset position (e.g., a lateral or longitudinal offset) of an actor, changing the trajectory of an actor, digitally adding or deleting actors, changing the motion behavior characteristics of an actor, or any permutations, combinations, and variations thereof. Specific example manipulations are described in more detail below with reference to FIGS. 7-13. In some implementations, the augmentation engine 204 may also modify environment, goals and assumptions. The process of manipulation may also be configured over a configurable range of possible supported variations.

In some implementations, the scenario production engine 206 generates simulation scenarios based on the augmented data 216. In some implementations, a scenario includes information describing one or more actors; an actor type for each actor; and actor motion behavior characteristics for each actor. For example, a typical simulation scenario specifies dynamic motion behavior characteristics including behavior characteristics relevant to how an actor interacts with a simulated autonomous vehicle and other actors in a simulated 3D world. The simulation scenarios may also include the initial conditions, a timeline of significant events and the related environmental conditions, but also the simulator configuration. In some implementations, the scenario production engine 206 generates a platform file 500 (See FIG. 5 below) describing at least one configuration of an autonomous vehicle and actors. For example, a scenario may include an ego-vehicle state describing its speed, an ego-vehicle local pose, actor dynamic states, calibration data (for executing simulations), and configuration data (for executing simulations). For example, a perception system simulation may require calibration data and configuration data for some aspects of the simulation of a particular perception system, such as its LIDAR system. In some implementations, a selectable range of variations in a configuration is supported by the platform file 500. In addition to configuration information, additional code or instructions may be included in the platform file 500 for use in generating simulations. In some implementations, the platform file 500 includes a configuration file that defines input files, configured variations of targets in the augmented data, metadata tags to define attributes of added actors such as a number of pedestrians, and other information required to generate changes in state in the scenario. In some implementations, the scenario production engine 206 may register a simulation scenario by generating a simulation identifier, assigning the simulation identifier to the simulation scenario, and storing the simulation scenario in the simulation data 212. For example, the simulation identifier may be a globally unique identifier (GUID). The simulation data 212 may be a database storing currently and previously available simulation scenarios indexed by their corresponding simulation identifiers.

A final component of the simulation data generator 160 is the optional simulator 208. The simulator 208 may execute a simulation based on a selected simulation scenario. For example, the simulation scenario may correspond to a perception simulation scenario that imitates the operation of the perception subsystem 154 or a planning simulation scenario that imitates the operation of the planning subsystem 156 of the autonomous vehicle 100. In some implementations, the scenario production engine 206 sends a simulation identifier to the simulator 208. The simulator 208 uses the simulation identifier to fetch a configuration of a matching simulation scenario from the simulation data 212 and executes a simulation based on the fetched simulation scenario configuration. The simulator 208 may create a run identifier (run ID) to associate with an execution (run) of the simulation. In some implementations, the simulator 208 may create a batch of a plurality of simulation scenario variations and execute the batch in a single execution. In such implementations, the simulator 208 may create a batch identifier (batch ID) to associate with the batch execution. The simulator 208 may generate a simulation result and/or a simulation log during the execution of the simulation and store it in the simulation data 212. In some implementations, the simulation result and/or a simulation log are one or more formatted messages including or encoded with state information of the autonomous vehicle 100 and other actors observed in the simulation. The simulation log may be stored in the database of simulation data 212 storing a historical log of simulation runs indexed by corresponding run ID and/or batch ID. More generally, the simulation result and/or a simulation log may be used as training data for machine learning engine 166.

Figure 3:
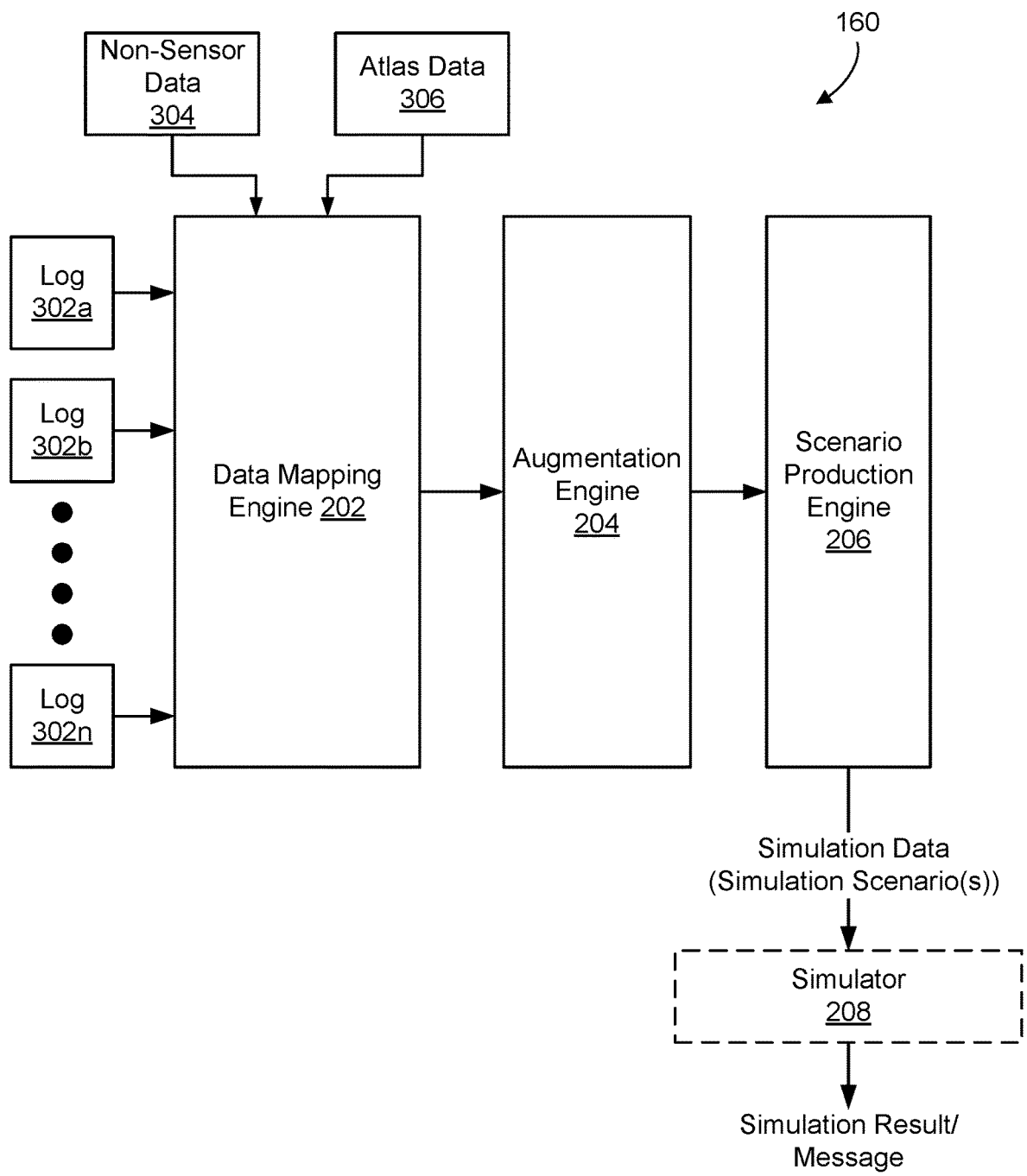
FIG. 3 is a block diagram of a simulation data generator according to some implementations.

As illustrated in FIG. 3, in some implementations the data mapping engine 202 may select from different snippets 302a, 302b . . . 302n of logged data 214. Additionally, FIG. 3 illustrates a particular advantage of the present disclosure, that it may generate the simulation scenario from real logged sensor data (e.g., snippets 302a, 302b . . . 302n of logged data) combined with other simulated data from non-sensor data sources 304 and other atlas or road map data. For example, there may also be some association of actors with roadway information. Similarly, the logged data may be associated with roadway information. In particular, the non-sensor data sources 304 may include data from video games or data from film or video. This non-sensor data, while less realistic, may also be mapped to the same set of global coordinates and be used as an additional source of data. More specifically, the data input to the data mapping engine 202 may be any combination of real logged data, video game data and film data. For example, an individual scenario may be based on sampling a snippet 302 of a much larger set of logged data 214. Snippets 302a, 302b . . . 302n of logged data 214 may be selected for use in generating a simulation scenario in different ways. For example, snippets 302 of logged data may include an identifier or tag identifying portions of the logged data of potential interest for generating simulation scenarios. For example, ID tags may be added, while collecting logged data, to identify one or more of a geography (e.g., San Francisco, New York, etc.), actors (e.g., other vehicles, bicycles, pedestrians, mobility scooters, motorized scooters, etc.), behaviors (e.g., lane change, merge, steering, etc.), location (e.g., four-way stop, intersection, ramp, etc.), status (e.g., deprecated, quarantined, etc.), etc. Alternatively, snippets 302 of logged data may be selected in other ways, such as by using a search tool to search for specific characteristics of portions of the logged data. Other approaches are also possible to select a snippet of logged data, including random selection techniques. Similarly, portions or snippets of the non-sensor data sources 304 may labeled with the same identifiers or tags based on geography, actors, behaviors, location, status, state, etc. FIG. 3 also illustrates the data flow through the simulation data generator 160 for the components of the data mapping engine 202, the augmentation engine 204, the scenario production engine 206, and optionally the simulator 208. As shown, once the different snippets 302a, 302b . . . 302n of logged data 214 and snippets from the non-sensor data sources 304 are selected and processed by the data mapping engine 202, the data mapping engine 202 sends the data for the identified actors, actor types, and actor motion behavior characteristics to the augmentation engine 204. As described above, the augmentation engine 204 receives that input and generates augmented data 216. The augmentation engine 204 outputs the augmented data 216 to the scenario production engineer 206 which generates one or more simulations scenarios. The scenario production engineer 206 provides the one or more simulations scenarios to the simulator 208 that executes the simulations defined by the one or more simulations scenarios and the execution of the simulator 208 produces simulations results or messages. These results or message can be stored in the data store for further analysis and/or use as training data.

Figure 4:
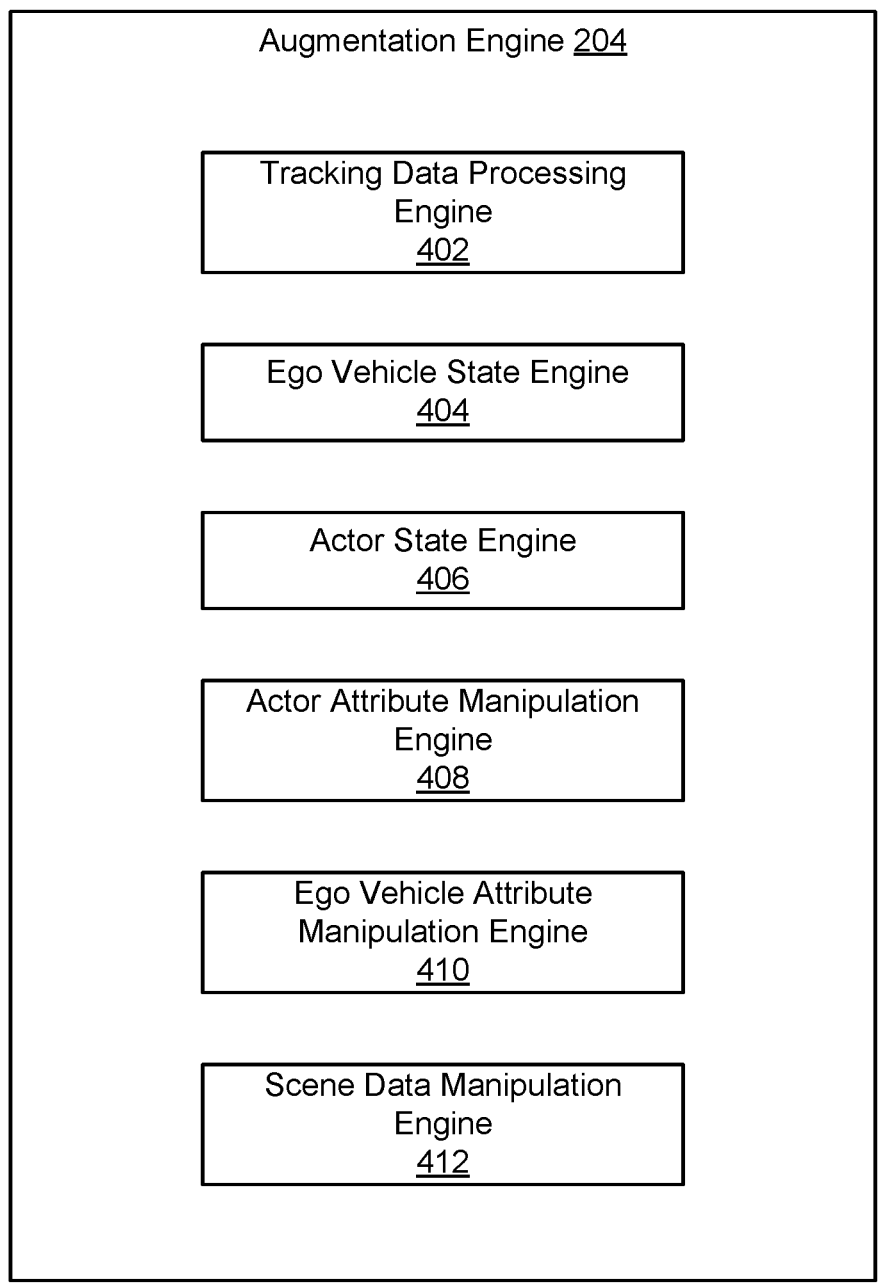
FIG. 4 is a block diagram of an augmentation engine according to some implementations.

Referring now to FIG. 4, an example of the augmentation engine 204 according to some implementations is illustrated. The augmentation engine 204 may include a tracking data processing engine 402, an ego-vehicle state engine 404, an actor state engine 406, an actor attribute manipulation engine 408, an ego-vehicle attribute manipulation engine 410, and a scene data manipulation engine 412.

In some implementations, the tracking data processing engine 402 performs an initial identification of actors and actor states from the mapped tracking data. An ego-vehicle state engine 404 is included in some implementations to determine a state of the ego-vehicle, such as an ego-vehicle location, pose, speed, etc. An actor state engine 406 is included in some implementations to manage actor states, such as actors, actor speeds, actor types, etc. An actor attribute manipulation engine 408 is included in some implementations to manipulate actor states and generate variations. Additional optional engines may be provided to perform other types of state manipulation. For example, to the extent that manipulation in ego-vehicle states is desired, such as ego-vehicle speed, an ego-vehicle attribute manipulation engine 410 may be provided to manipulate ego-vehicle states. In some implementations, other aspects of a scene may be manipulated, such as adding sidewalks for pedestrians. A scene data manipulation engine 412 may be provided to implement manipulations of the environment in a scene. Examples of specific manipulations that are performed respectively by the tracking data processing engine 402, the ego-vehicle state engine 404, the actor state engine 406, the actor attribute manipulation engine 408, the ego-vehicle attribute manipulation engine 410, and the scene data manipulation engine 412 will be described in detail below with reference to FIGS. 7-13. From the description below, the processes, changes and modifications that each of these engines 402, 404, 406, 408, 410, 412 make to the data input from the data mapping engine 202 can be easily understood.

Figure 5:
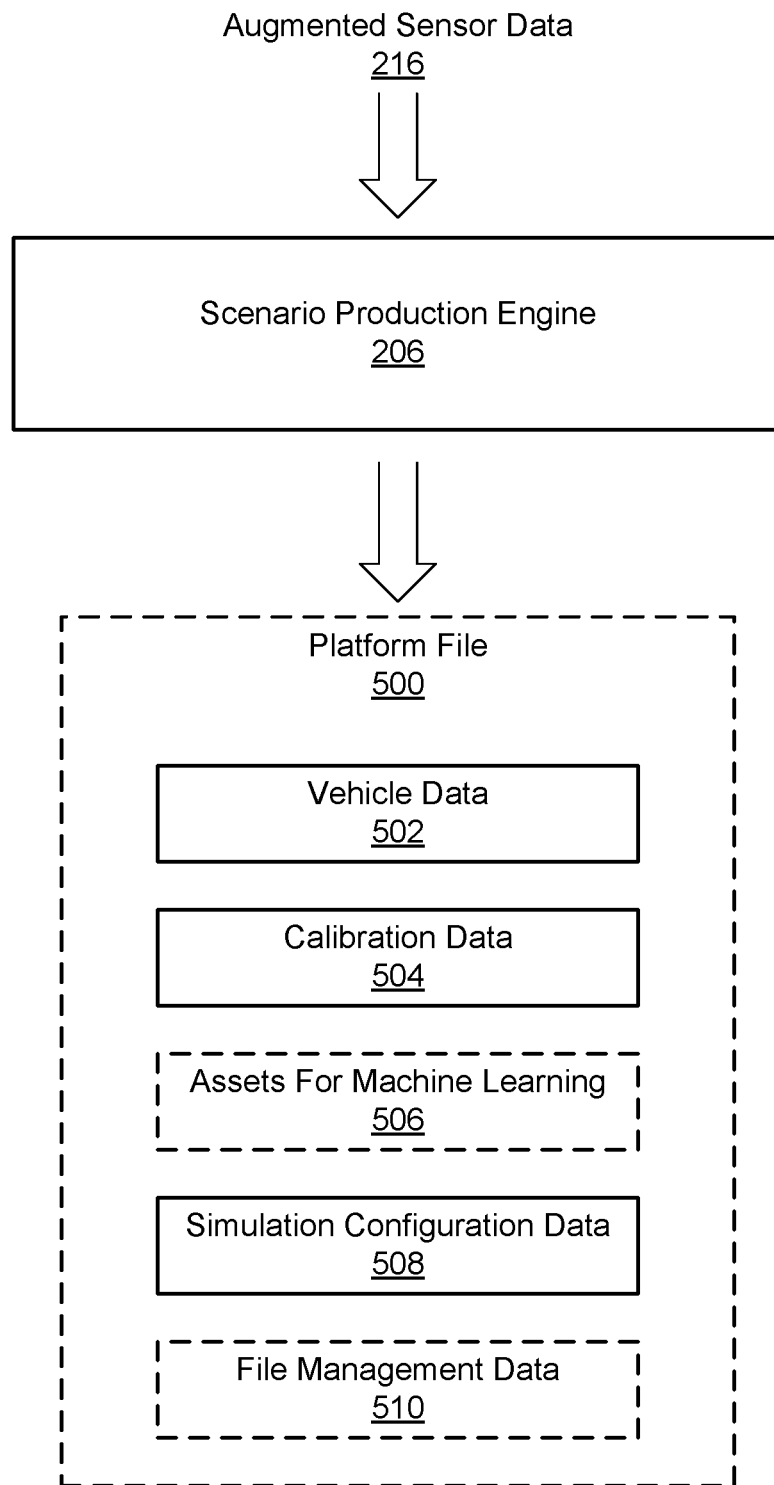
FIG. 5 is a block diagram of scenario production engine according to some implementations.

Referring now to FIG. 5, an example of the scenario production engine 206 according to some implementations is illustrated. The scenario production engine 206 receives the augmented data 216 from the augmentation engine 204 or retrieves it from data storage 280. The scenario production engine 206 process the augmented data 216 to generate one or more simulation scenarios. In some implementations, the simulation scenarios generated by the scenario production engine 206 take the form of a platform file 500. A platform file 500 of a simulation scenario may be implemented in different ways. The platform file 500 may be a single file as shown in FIG. 5 or a group of files each storing a different type of data as described below. In the example shown in FIG. 5, the platform file 500 includes vehicle data 502 describing information on vehicles and other actors in scenario (e.g., actors), calibration data 504 for variables that require calibration required to execute the simulation, assets 506 for machine learning (e.g., resources for machine learning), simulation configuration data 508 that specifies the configuration information for a simulation, and optionally a file management data file 510 for general management functions. In some implementations, the calibration data 504 calibrates an attribute of the ego-vehicle or an actor. The configuration data 508 is used to configure different aspects of simulations. That is, the platform file 500 may include information and code that subsequent simulations use as an aid to generate and execute one or more simulations.

Figure 6:
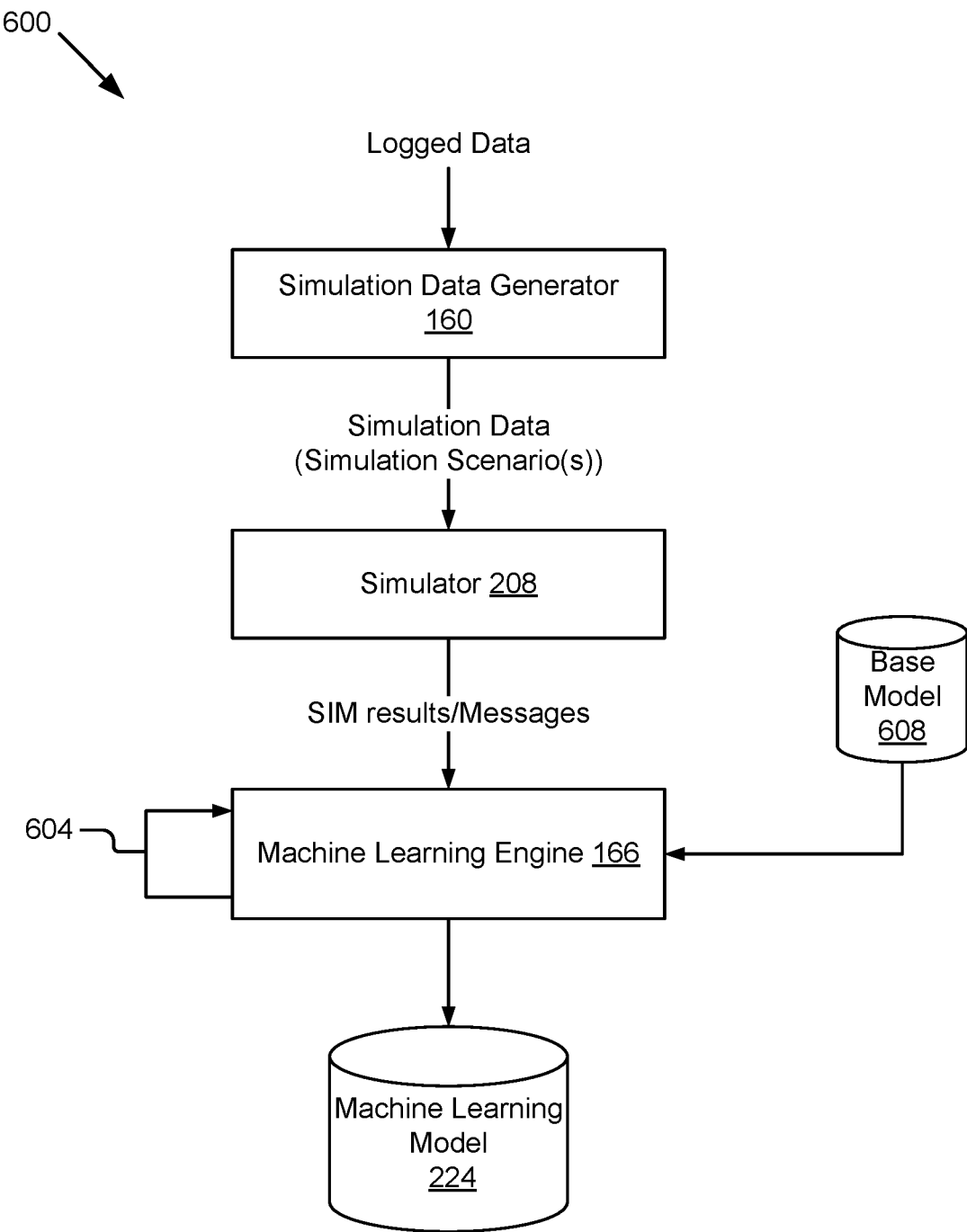
FIG. 6 is a flow chart illustrating a data flow through the simulation data generator, a simulator and a machine learning engine referenced in FIG. 3

Referring now to FIG. 6, a block diagram illustrating an example of a data flow through the simulation data generator 160, the simulator 208, and the machine learning engine 166 will be described. The logged data is received by the simulation data generator 160, which generates simulation data (e.g., one or more simulation scenarios). The simulator 208 receives simulation data or simulation scenario as has been described above and executes a simulation based on the simulation scenario. This may include simulations to evaluate components of the autonomous vehicle 100, such as a simulation of a perception subsystem 154 or a planning subsystem 156. The execution of the simulation generates simulation results or messages encoded with state information associated with the behavior of the autonomous vehicle 100 and other actors in the simulation scenario. In some implementation, the simulation results/messages from the simulator 208 are used as a source of training data for a machine learning engine 166 used to train machine learning model 224. The machine learning engine 166 retrieves a base model 602 and uses the simulation data to train the base model 602 and generate a trained machine learning model 224. The simulation data may be repeatedly and iteratively used to improve the accuracy of the machine learning model 224 as represented by line 604 to and from the machine learning engine 166 in FIG. 6. Thus, the simulation data may also be used for re-training or refinement of the machine learning model 224. The improved machine learning model 224 can in turn be used by the perception subsystem 154, for example. Various other specific parameters of any of the machine learning models 224 for perception, location, planning or control may be similarly trained or refined using validated data generated specifically for a particular parameter by the computing system 172.

In some implementations, the machine learning engine 166 may generate training instances to train a neural network model. For example, in some implementations, the simulation result may be used by machine learning engine 166 to generate updates with respect to a base model 608. In some implementations, the simulation results are used to generate a predicted output of the machine learning model 224, which is then used to update one or more weights in the machine learning model 224 by determining a difference between the predicted output and a simulated output.

In some implementations, the machine learning model 224 is a neural network model. Additionally, or alternatively, the neural network engine 166 may compare the predicted neural network model output with a neural network model known output (e.g., simulated output generated from the simulation scenario) from the training instance and, using the comparison, update one or more weights in the neural network model. In some implementations, one or more weights may be updated by backpropagating the difference over the entire neural network model.

In a variety of implementations, a neural network model can be trained using supervised learning, unsupervised learning, and semi-supervised learning. Additionally, or alternatively, neural network models in accordance with some implementations can be deep learning networks including recurrent neural networks, convolutional neural networks, networks that are a combination of multiple networks, etc.

In some implementations, one or more aspects of the simulation scenario may be selected to aid in generating a wider variety of instances of training data. For example, one or more scenarios may have a configurable range of variations in the speed of actors selected to increase the variety of training data used to train the machine learning model 224. As a simple example, varying the speed of actors in a scenario may be useful to train the machine learning model 224 to make one or more predictions over a range of actor speeds that may not have occurred in the original logged data.

As another example, changing the actor type in a scenario may be useful to train the machine learning model 224 to make predictions over a range of actor types that may not have occurred in the original logged data.

As an illustrative but non-limiting example, increasing the speed of actors may be useful for a variety of purposes, such as generating simulations indicative of how well a simulated perception subsystem 154 makes predictions for different scenarios, such as making predictions about the detection of simulated actors or the detection of attributes of simulated actors (e.g., a detection of the brake lights of a simulated actor). For example, increasing a speed of an actor or changing it to a different actor type (e.g., changing it from a truck to a motorcycle) may pose a greater detection challenge to a perception subsystem 154.

As another illustrative but non limiting example, changing the behavioral response of an actor, such as changing its perception range or intelligence, may be useful for generating simulations to test how well a planning subsystem 156 makes predictions for responding to different situations.

In some implementations, the selection of the logged data and the manipulations performed by the augmentation engine 204 may be selected to further one or more aspects of training the machine learning model 224.

Figure 7:
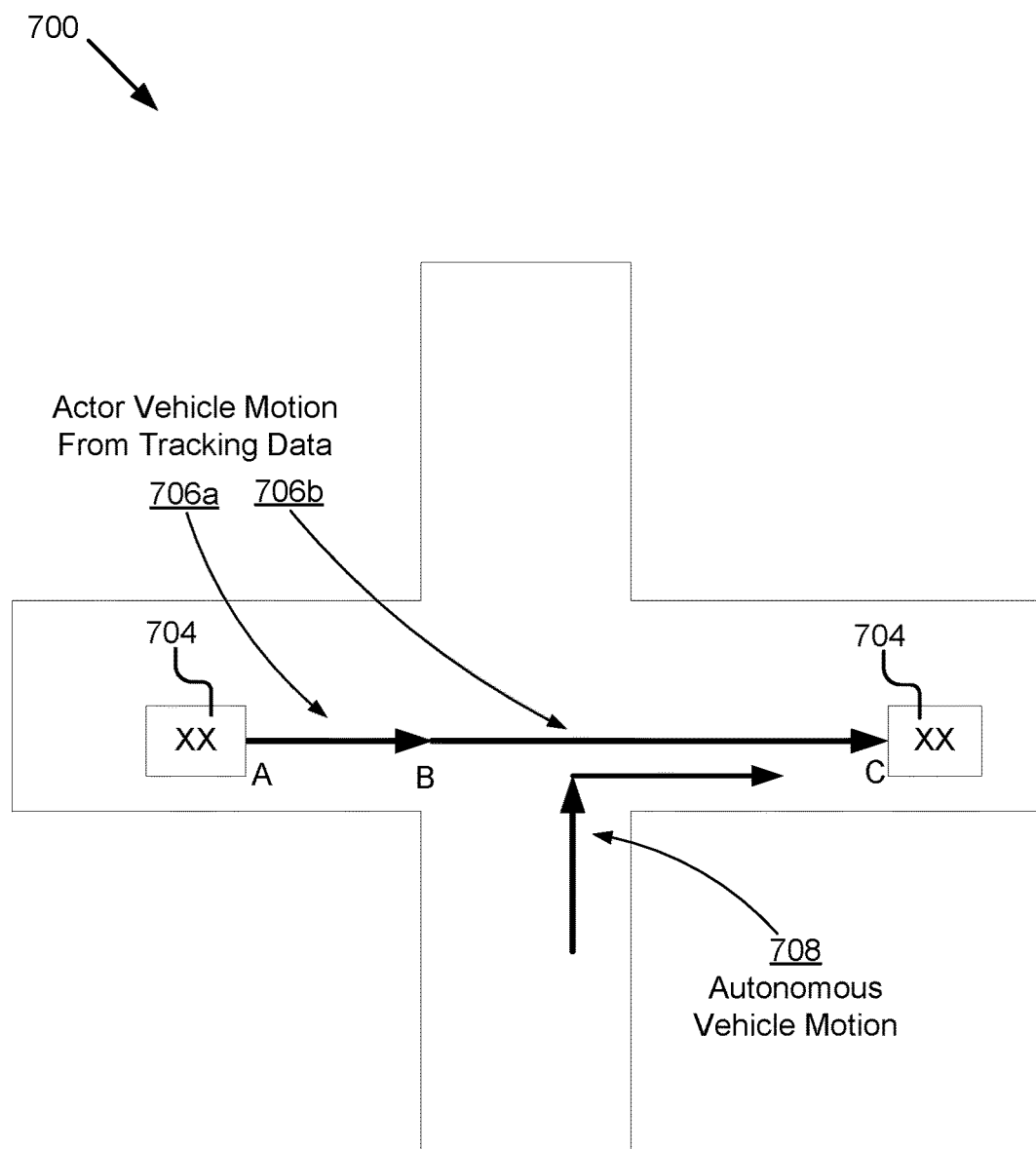
FIG. 7 illustrates a diagram of simulated data generated from logged data in accordance with some implementations.

FIGS. 7-13 are diagrams that illustrate graphical representations of the simulated data or mutated simulated data. The example of simulated data in FIGS. 7 and 12A are generated from logged data in accordance with the implementations that have been described above. For the purposes of illustration, an example of an autonomous vehicle 100 making a right turn at an intersection is illustrated, although it will be understood that variations may be generated from other different possible starting situations including but not limited to examples of an ego-vehicle making a left turn, an ego-vehicle continuing straight on a road, a ego-vehicle stopping or restarting, etc. The simulated data also includes another actor vehicle that was detected by the sensors of the autonomous vehicle 100 as represented in the logged data. FIGS. 8A11B and 12B-13 are diagrams that illustrate mutations of the simulated data (generated from logged data of FIG. 7 or 12A) where the mutations vary different aspects of actors and behaviors of actors.

FIG. 7 illustrates an example representation 700 of the simulated data that has been generated from the logged data. The representation 700 shows arrows for the motion of the autonomous vehicle 100 based on the logged data. In this example, the motion of an actor vehicle XX 704 is illustrated by the lines 706a, 706b from point A to point B and point B to point C, which is based on the logged data. Actor vehicle XX 704 has an associated shape and size associated with its actor type, as illustrated by the rectangular box. In this example, actor vehicle XX 704 traverses a path from position A to position B shown by line 706a and then from position B to position C shown by line 706b. The motion of the autonomous vehicle 100 is represented by lines 708 showing in a right turn.

Figure 8A:
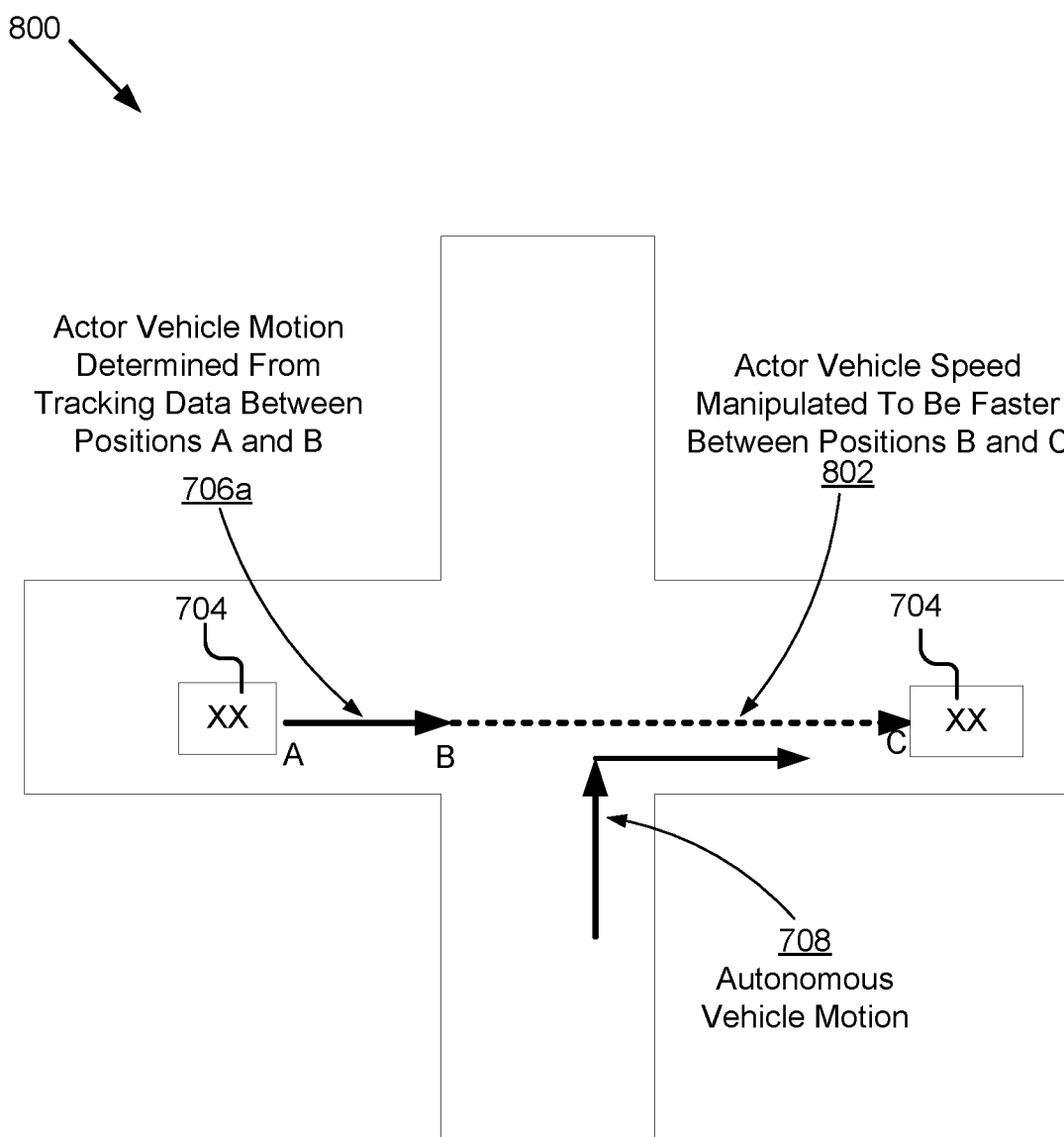
FIG. 8A illustrates a diagram of simulated data mutated for greater speed of an actor in accordance with some implementations.
Figure 8B:
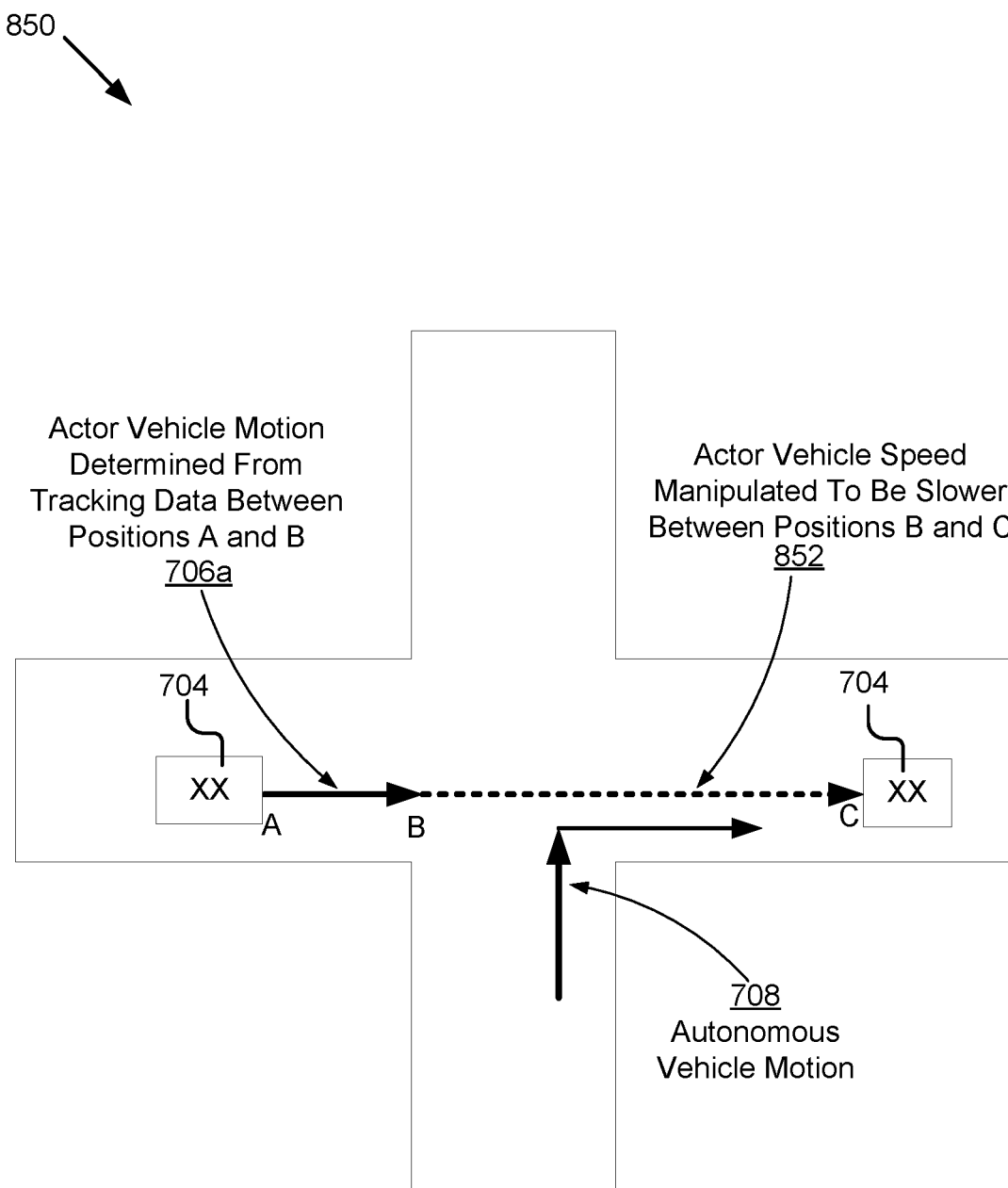
FIG. 8B illustrates a diagram of simulated data mutated for reduced speed of an actor in accordance with some implementations.

Some examples of manipulations that may be performed by the augmentation engine 202 include changing a speed or acceleration of an actor. For example, starting with the actor velocity or acceleration, the actor's motion along its tracked trajectory may be manipulated to have a faster speed, greater acceleration, slower speed, or slower acceleration. FIG. 8A illustrates an example representation 800 of mutated simulation data produced by the augmentation engine 202 from the simulation data of FIG. 7. In the representation 800 of mutated simulation data, the actor vehicle XX 704 speed is manipulated to be faster between positions B and C as represented by dashed line 802. Similarly, in another example of mutated simulation data, the actor vehicle XX 704 speed is manipulated to be slower between positions B and C. FIG. 8B shows the representation 850 of mutated simulation data where the actor vehicle XX 704 speed is manipulated to be slower between positions B and C as represented by dashed line 852.

Figure 9A:
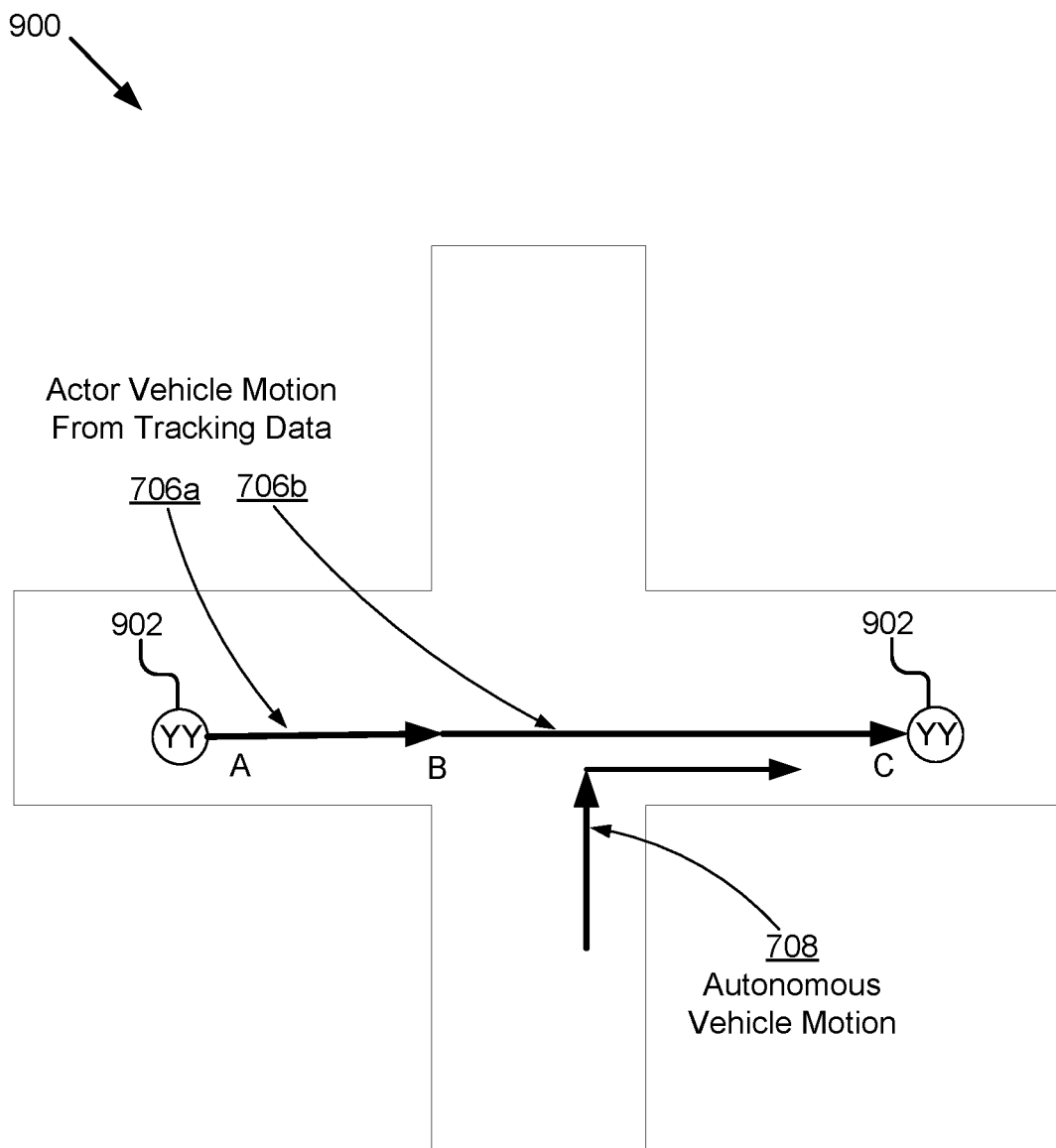
FIG. 9A illustrates a diagram of simulated data in which an object is mutated to be a different type of object in accordance with some implementations.
Figure 9B:
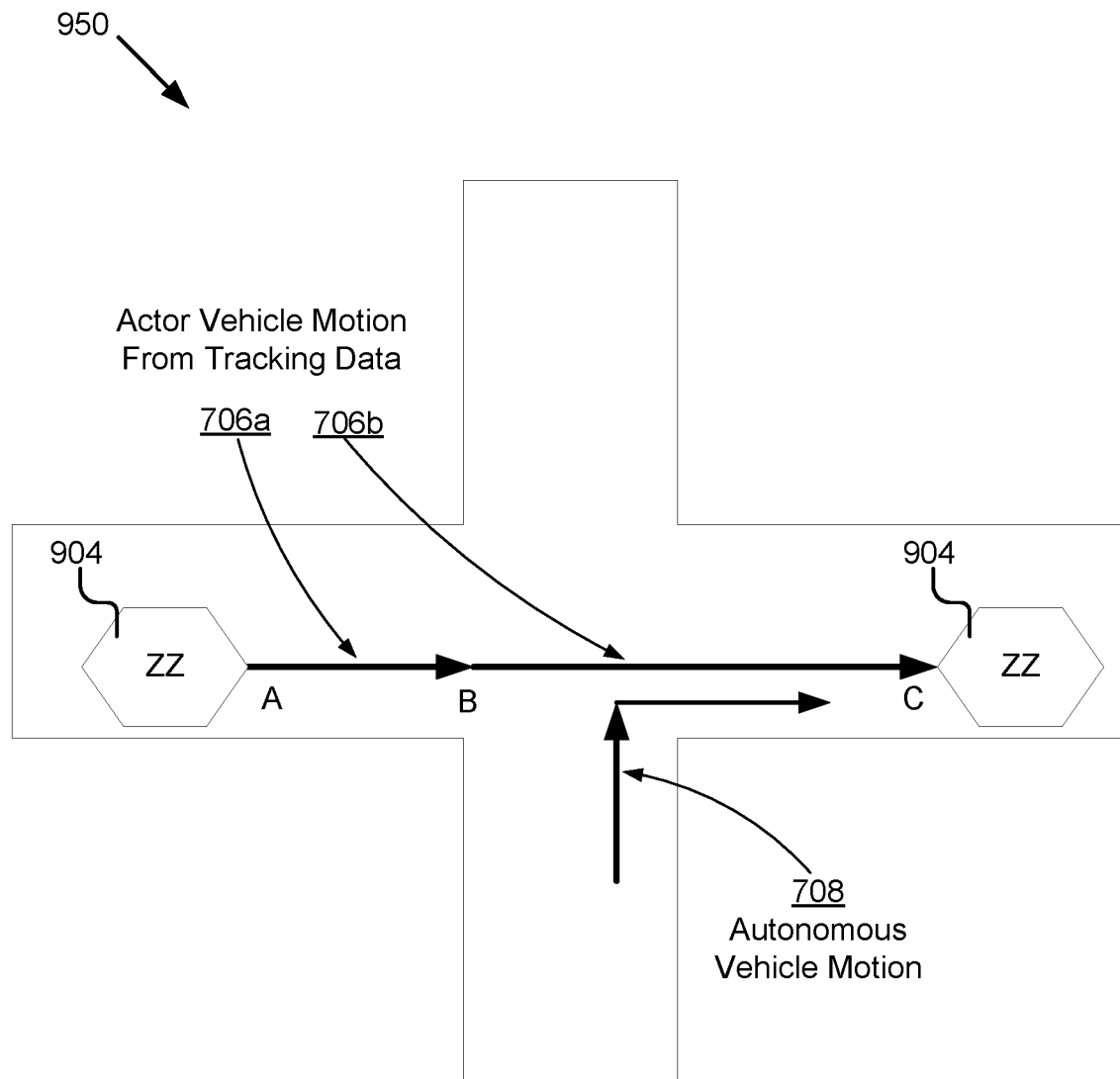
FIG. 9B illustrates a diagram of simulated data in which an object is mutated to be a different size in accordance with some implementations.

Other examples of manipulation include changing an actor type from one actor type 704 to another actor type 902, 904. For example, suppose an actor type 704 had a size and shape corresponding to that of a car. The actor type 704 may be changed to that of an actor having a different size and shape, such as that of a motorcycle or a truck. Other possibilities include changing a vehicle to a pedestrian. Again, FIGS. 9A and 9B illustrate examples representations 900, 950 of mutated simulation data produced by the augmentation engine 202 from the simulation data of FIG. 7. FIG. 9A shows a representation 900 of mutated simulation data produced from the simulation data of FIG. 7 in which the actor vehicle type 704 is mutated to be a different type of vehicle, YY, 902. For example, a car vehicle type 704 may be mutated to be a motorcycle vehicle type 902. FIG. 9B shows a representation 950 of mutated simulation data produced from the simulation data of FIG. 7 in which the actor vehicle type 704 is mutated to be a different size of object, vehicle, ZZ, 904. This may include, for example, variations in length, width or height of an actor that is a vehicle. For example, a vehicle type that is a car may be mutated to be a different size of truck, such as a longer or shorter truck. In this example, the mutation results in a larger size of the object, vehicle ZZ 904, although more generally, the mutation may result in a smaller size of the object. From the example mutations of FIGS. 9A and 9B, it can be understood how any type or characteristic of an actor type may be changed from the simulation data by the augmentation engine 202.

Figure 10A:
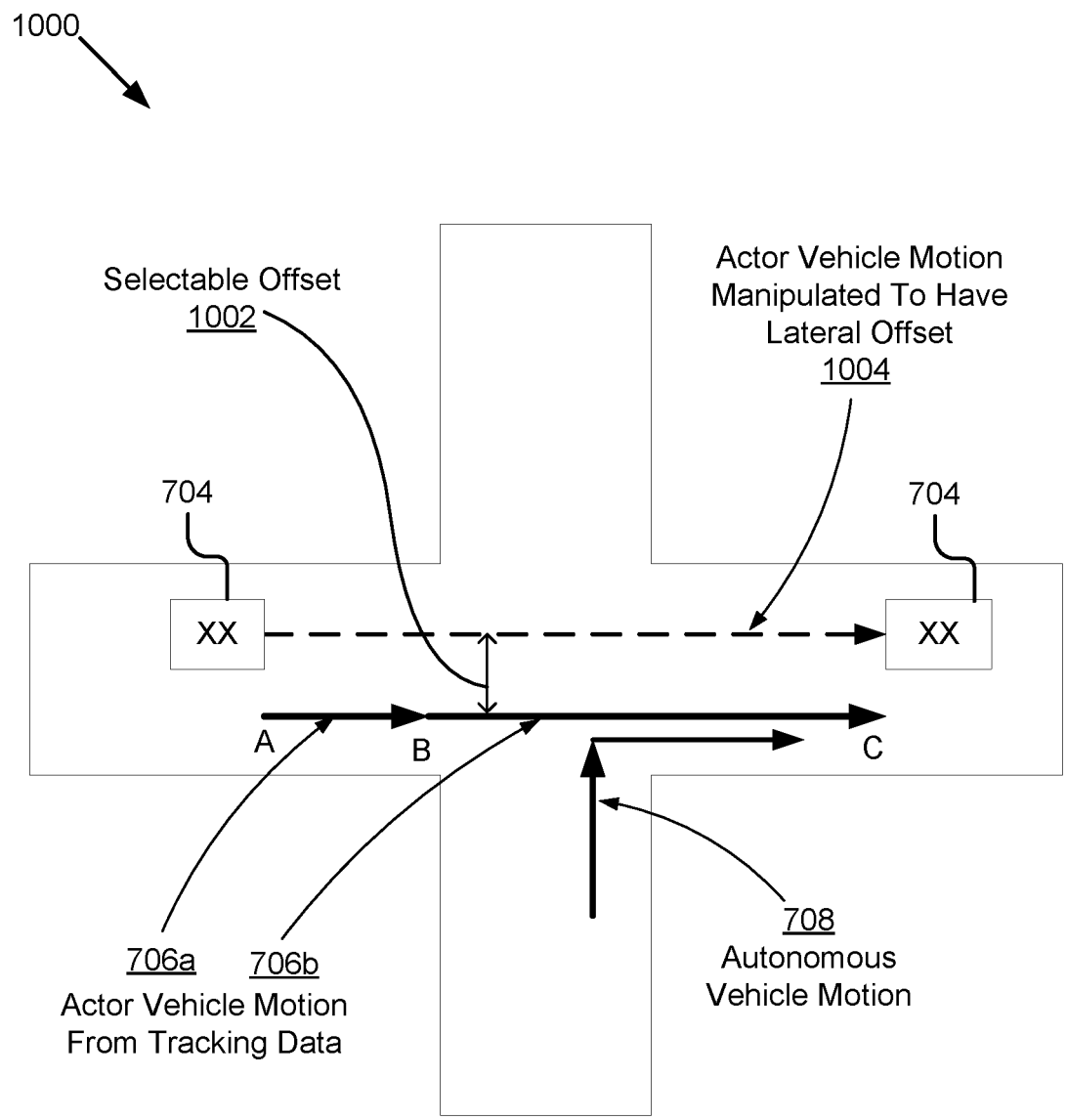
FIG. 10A illustrates a diagram of simulated data in which an object has a path mutated to have a lateral offset from the original path in accordance with some implementations.
Figure 10B:
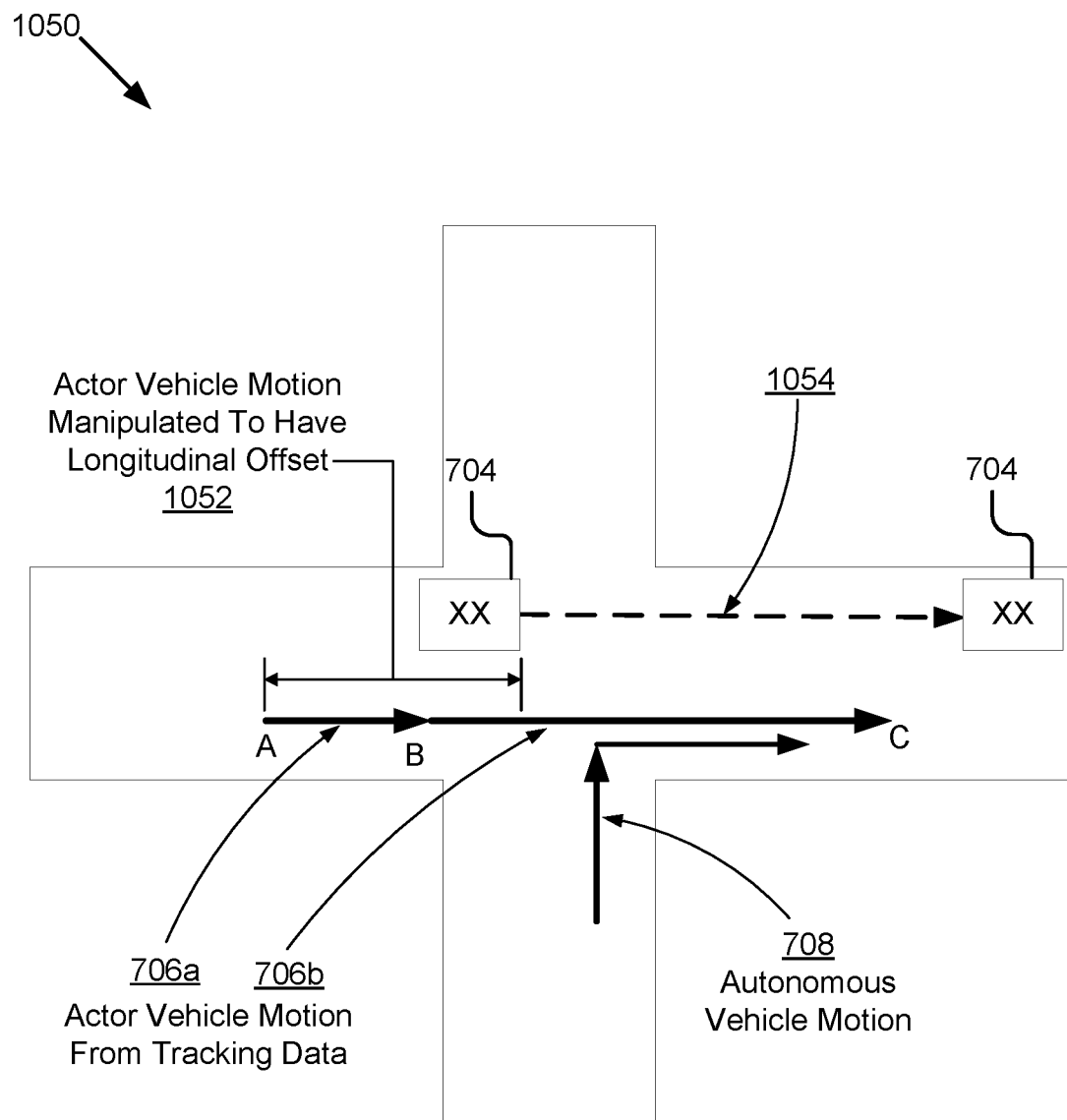
FIG. 10B illustrates a diagram of simulated data in which an object has a path mutated to have a longitudinal offset from its original path in accordance with some implementations.

Other examples of manipulations that may be performed by the augmentation engine 202 include manipulating the path of an actor. For example, a selectable offset 1002, 1052 in position (e.g., a lateral or longitudinal offset) may be introduced in to the trajectory of an actor. Variations may be introduced into the trajectory of an actor, such as by adding a time varying signal or noise source into the trajectory of the actor, such as adding a variance in position or speed. For example, suppose an actor was moving in a comparatively straight trajectory with a nearly constant speed. A variance in position or speed within a selected maximum swing may be added to the position or speed of the actor about the original trajectory. For example, an additional controller signal may simulate physically realistic variations of position and speed with a maximum range of variations (e.g., a ±5% variation, a ±10% variation, a ±15% variation, etc.). Again, FIGS. 10A and 10B illustrate examples representations 1000, 1050 of mutated simulation data produced by the augmentation engine 202 from the simulation data of FIG. 7. FIG. 10A shows a representation 1000 of mutated simulation data produced from the simulation data of FIG. 7 in which the actor vehicle XX 704 is mutated to have a lateral offset 1002 of the path 706*a*, 706*b* to a new path 1004. For example, the mutation may introduce a selectable offset 1002 to shift the actor vehicle XX 704 from one traffic lane or to an adjacent traffic lane. FIG. 10B shows a representation 1050 of mutated simulated data produced from the simulation data of FIG. 7 in which the simulated data is mutated to also have a longitudinal offset 1052 of path 1054 in addition to the lateral offset of FIG. 10A. FIG. 10B illustrates not only that a longitudinal offset 1052 can be added, but also that multiple offsets can be combined.

Figure 11A:
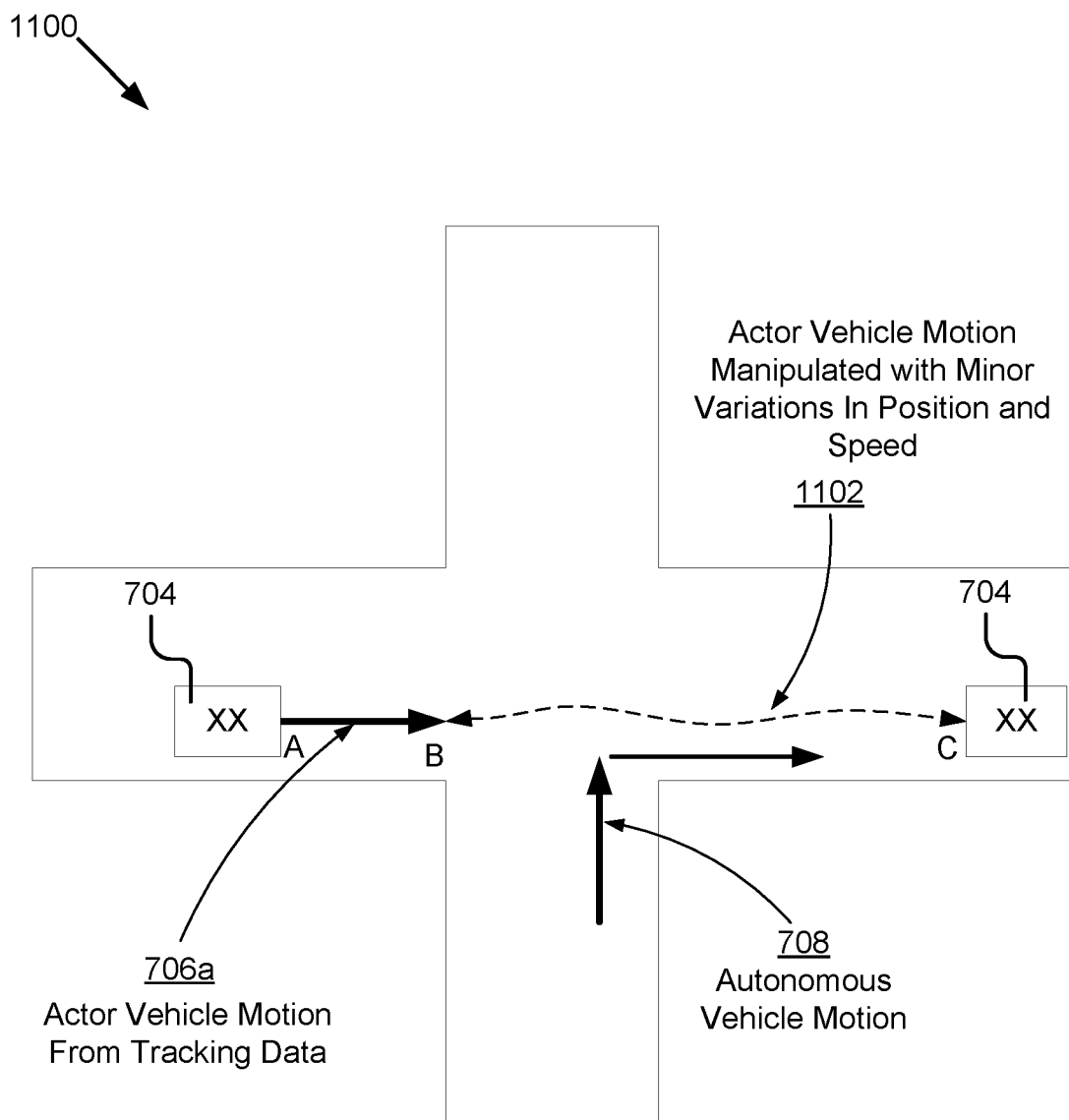
FIG. 11A illustrates a diagram of simulated data mutated along a portion of a path to have minor variations in path and speed in accordance with some implementations.
Figure 11B:
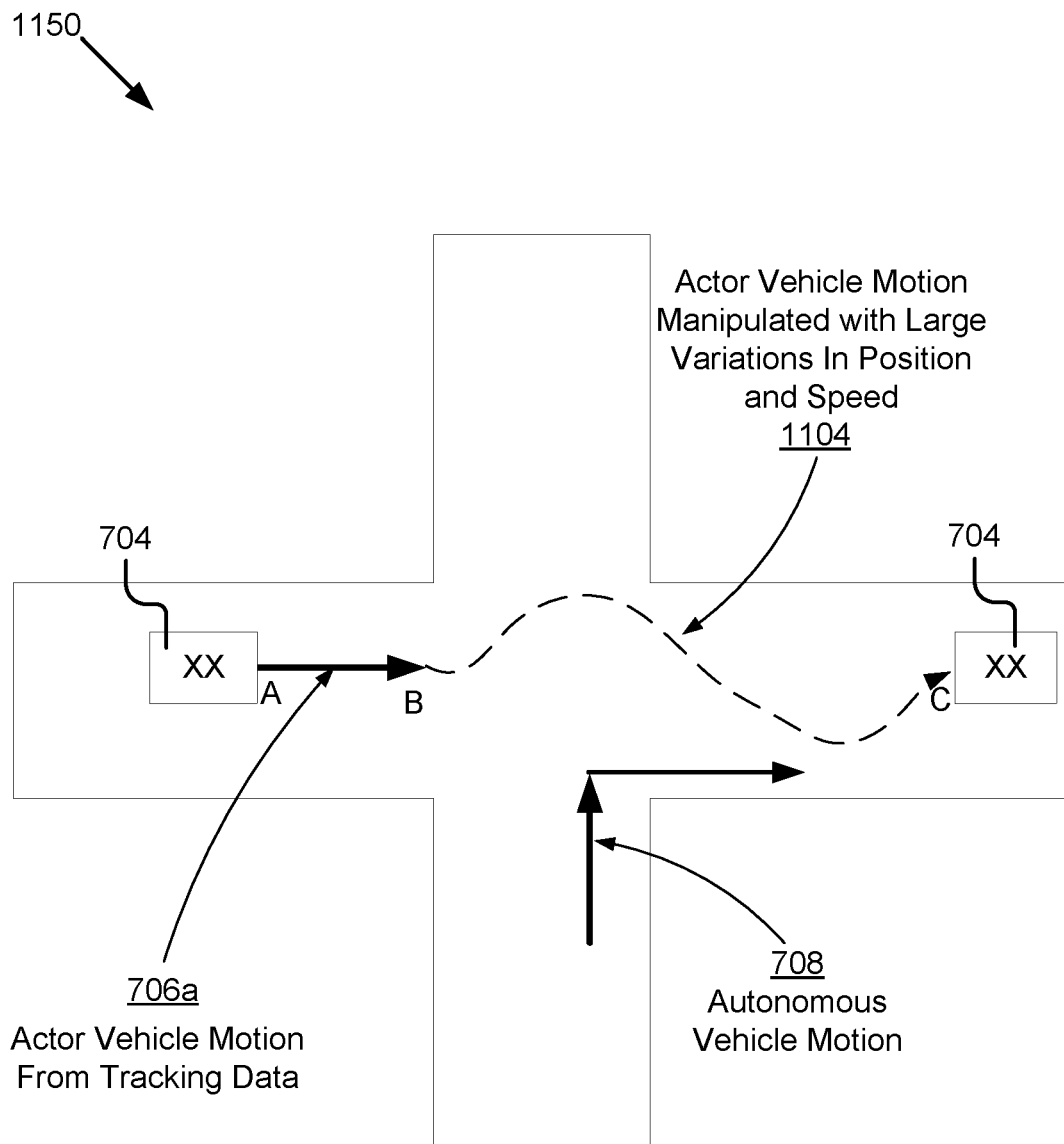
FIG. 11B illustrates a diagram of simulated data mutated along a portion of a path to have major variations in path and velocity in accordance with some implementations.

As another example, the behavior of an actor may simulated to follow its original trajectory (based on the logged data) up to a certain point (e.g., point B) and then the rules governing the actor's motion may be varied (e.g., making the actor to be no longer bound by the original trajectory). For example, the path of the actor may be modified by introducing direction changes or variations or modifying the trajectory to follow breadcrumbs or different points from the starting point to the end point. FIGS. 11A and 11B illustrate examples representations 1100, 1150 of mutated simulation data produced by the augmentation engine 202 from the simulation data of FIG. 7 for such variations. For example, a motion planning function may be turned on or off for the actor. FIG. 11A shows the representation 1100 of mutated simulation data produced from the simulation data of FIG. 7 in which the actor vehicle XX 704 is mutated to have minor variations in position and speed on the path 1102 between points B and C. Likewise, FIG. 11B shows the representation 1150 of mutated simulation data produced from the simulation data of FIG. 7 in which the actor vehicle XX 704 is mutated to have major variations in position and speed on the path 1104 between points B and C.

Figure 12A:
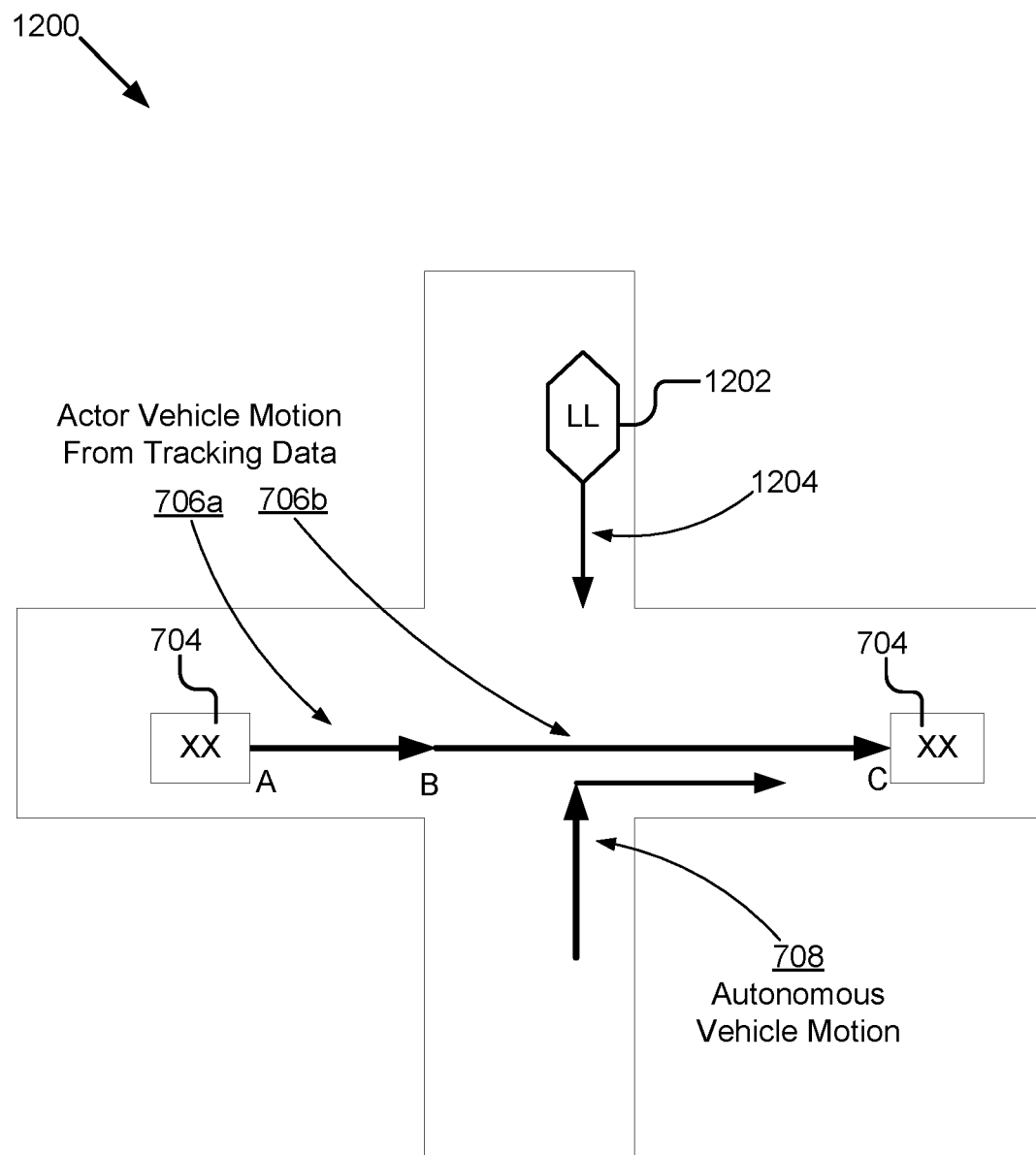
FIG. 12A illustrates a diagram of simulated data generated from logged data in accordance with some implementations.
Figure 12B:
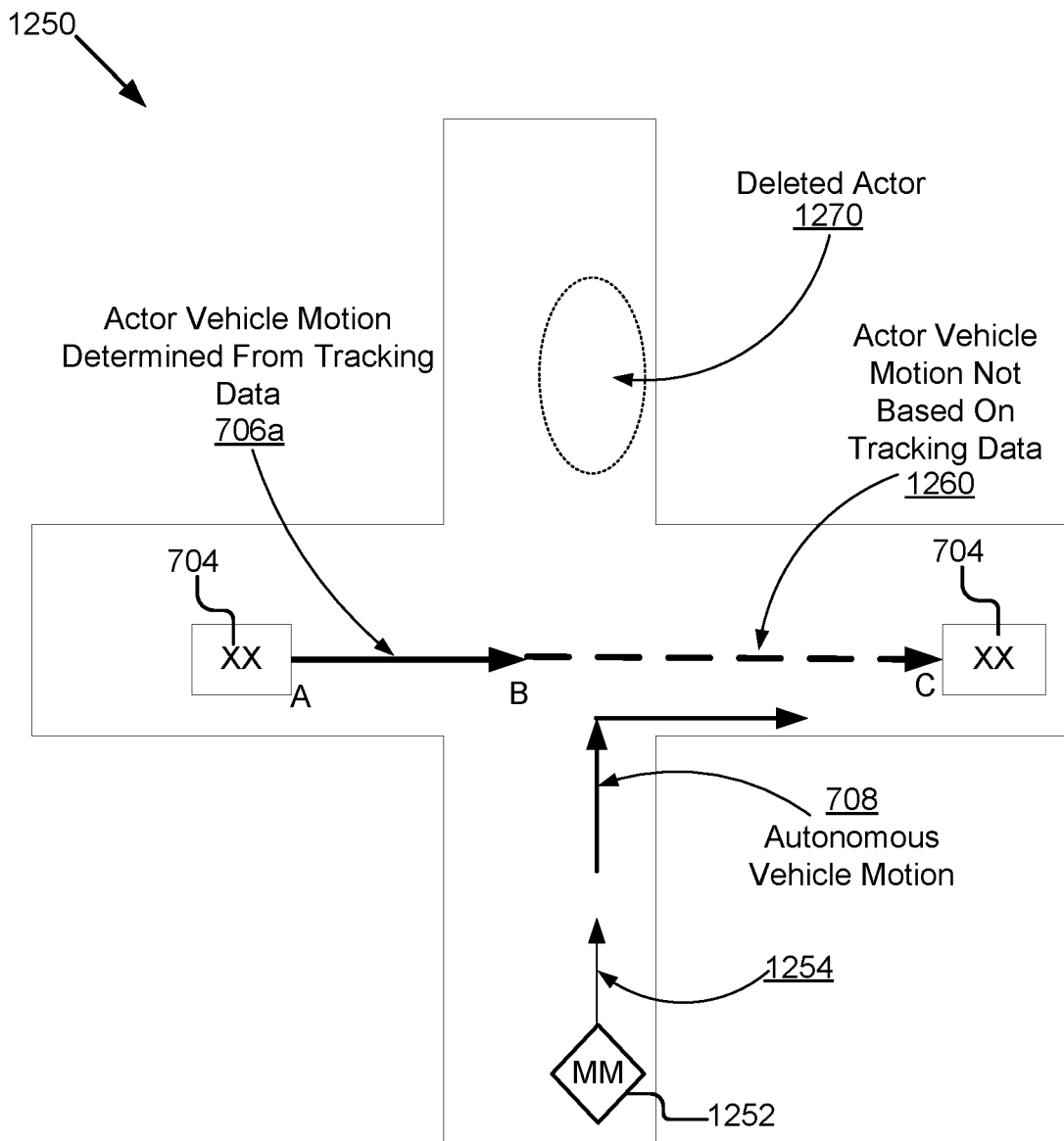
FIG. 12B illustrates a diagram of simulated data mutated by adding or deleting actors and optionally varying actor vehicle motion response in accordance with some implementations.

Other examples of mutation or manipulation also include digitally adding or deleting actors. For example, suppose that there were two cars and one truck identified from the original log sensor data. One of the two cars may be digitally deleted. Another vehicle, such as a motorcycle, may be digitally added. As another example, pedestrians may also be added. FIG. 12A illustrates an example representation 1200 of the simulated data that has been generated from the logged data. FIG. 12A is similar to FIG. 7; however, it includes an additional actor LL 1202 on a path 1204 based on the logged data. The representation 1200 again shows arrows for the motion of the autonomous vehicle 100 based on the logged data. The motion actor vehicle XX 704 traverses a path illustrated by the lines 706*a*, 706*b* from point A to point B and point B to point C, respectively, which is based on the logged data. Actor vehicle XX 704 has an associated shape and size associated with its actor type, as illustrated by the box. The motion of the autonomous vehicle 100 is represented by lines 708 showing in a right turn. Actor LL 1202 has an associated shape and size associated with its actor type and is illustrated by the hexagon. Actor LL 1202 traverses a straight path as shown by line 1204. FIG. 12B shows the representation 1250 of mutated simulation data produced from the simulation data of FIG. 12A which has been mutated in a number of different ways. First, an actor, LL 1202, has been deleted, an actor MM 1252 has been added, and motion of actor XX has been modified between points B and C. This again illustrates how any number of modifications or mutations of the original simulation data generated from logged data may be changed in different aspects to create even more simulation scenarios. FIG. 12B is also provided to illustrate how actors can be deleted or added to produce mutated simulation data. As shown in FIG. 12B, in this example, actor LL 1202 is deleted 1270. Also, a new actor MM 1252 has been added. Actor MM 1252 has an associated shape and size associated with its actor type and is illustrated by the diamond on a path 1254 with a position below and following the motion of the autonomous vehicle 100. Other mutations are also possible, such as mutating the motion of actor vehicle XX 704, such as varying 1260 its motion after point B to point C so that it is not be based on the tracking data.

Figure 13:
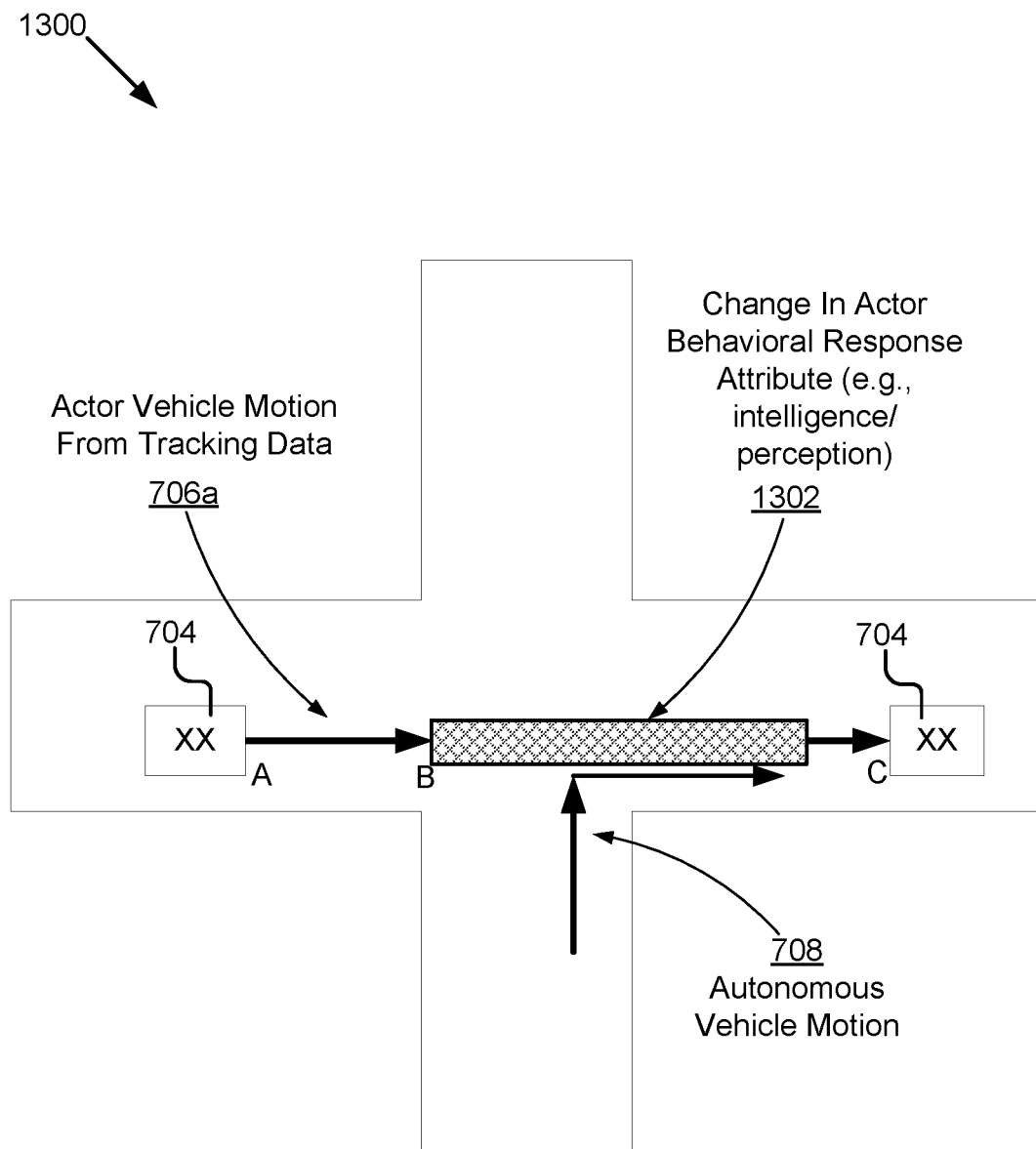
FIG. 13 illustrates a diagram of simulated data mutated by changing an actor's behavioral response in accordance with some implementations.

Other examples include changing the motion behavior characteristics of an actor in the sense of changing the rules regarding how an actor perceives and interacts with other actors and with the autonomous vehicle 100. For example, a perception range of an actor may be varied. As another example of manipulations, an actor may have different rules governing how intelligently it interacts with other actors or with the ego-vehicle. For example, different rule sets may be applied regarding how actor-vehicles interact with pedestrians. In some implementations, an actor may be a path follower. In some implementations, an actor may be a breadcrumb follower in the sense that it is attracted to an actor's breadcrumb in a simulation scenario. FIG. 13 shows the representation 1300 of simulated data that has been mutated by changing an actor's behavioral response characteristics. In this example, the actor vehicle XX 704 motion from points A to B is based on tracking data. After point B, the actor vehicle XX 704 motion may be based in part on being based on the actor being assigned an actor type having a motion behavioral response. For example, an actor XX 704 might vary its speed and position after point B based on the presence of other actors that are nearby. Or the actor's motion response might be varied in other ways, such that its motion is no longer based on the logged data after point B. The change in actor behavioral response attribute (e.g., intelligence/perception) of the actor vehicle XX 704 from point B to point C is shown by the crosshatched area 1302 of FIG. 13.

Additionally, many permutations, combinations, and variations are possible. For example, the augmentation engine 204 may implement combinations such as varying a first actor's speed, deleting a second actor, changing a third actor to a different actor type, etc. As another example, an actor's speed may be varied and the actor type may both be changed. Thus, for example, if the originally identified actor was a car moving at some initial speed, the manipulation may change the actor type to a truck moving at twice the initial speed.

The process of manipulation may also be configured over a configurable range of all possible supported variations. For example, a speed of an actor may be manipulated over a range of speeds. The actor type may be manipulated over a range of actor types. The actor size may be manipulated over a range of actor sizes. Lateral or longitudinal offsets may be manipulated over a range of lateral and longitudinal offsets. A noise variance in speed and position along a path may be varied over a range. An actor's perception range may also be varied over a range of perception ranges. Other aspects of the behavioral response of an actor may be varied over a supported range of possibilities, such as a supported range of actor intelligence types. These modifications are all within the scope of the present disclosure.

Figure 14:
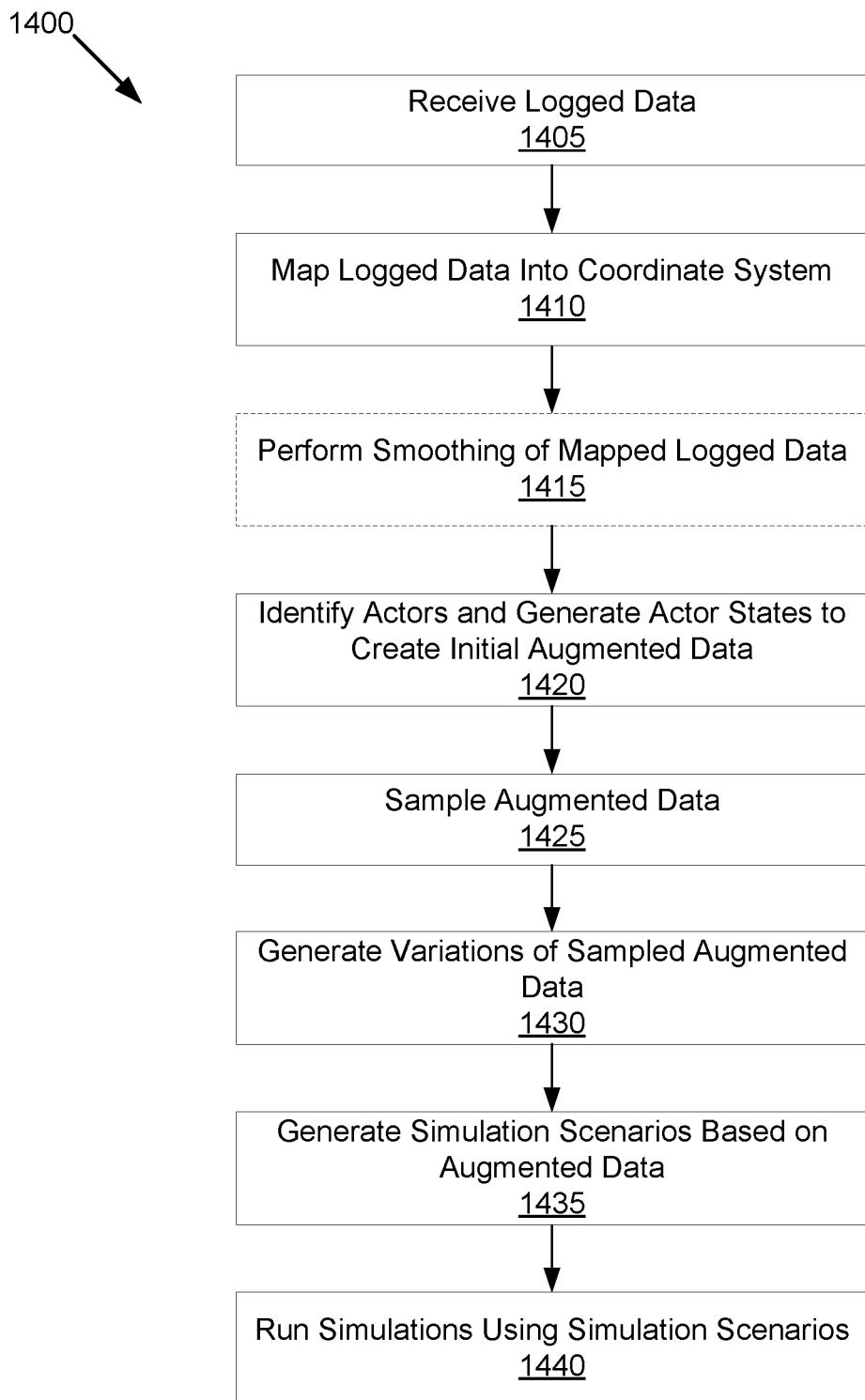
FIG. 14 is a flow chart illustrating a method of using logged data to generate simulated data according to some implementations.

FIG. 14 illustrates a flowchart of a method 1400 in accordance with some implementations. In block 1405, logged data 214 is received or retrieved. As noted above, for example, the logged data 214 may include raw sensor data from any one or more of the sensors 130, state or localization data from localization subsystem 152, state or perception data from perception subsystem 154, state or planning data from the planning subsystem 156 or state or control data from the control subsystem 158. In some examples, the logged data is received as it is collected. In other examples, the logged data 214 is retrieved from the data storage 280. In block 1410, the logged data 214 is mapped into a coordinate system of a simulation. In some implementations, the logged data 214 is mapped into global coordinates in order to map the motion of the ego-vehicle and actors in the global coordinate system. An example coordinate system is an orthogonal curvilinear coordinate (OCC) system. In block 1415, optional smoothing is performed of the mapped logged data to generate smoothed data. This may include noise-filtering or interpolation as examples. In some implementations, smoothing is performed from simulations data at a later stage. The smoothed data or the mapped logged data is then used to create the augmented data. In block 1420, in some implementations, the method 1400 identifies actors and generates actor states to create initial augmented data. For example, initial actor information is identified from the mapped and smoothed logged data. This may include one or more rules regarding identifying actors based on verifying that an actor occurs in a meaningful number and frequency of instances of the logged data. In some implementations, the identified actors are fit to a movement model to estimate their movement. This creates an initial form of the augmented data. In block 1425, the initial augmented data of block 1420 is sampled. For example, not all of the initial actor information may be required to generate a variation of the augmented data. For example, it may be desired to vary aspects of individual actors. So individual actors can be sampled, certain behaviors can be sampled, or locations, poses, other variable in the simulation can be sampled from the full set of logged data 214 that has been converted to the initial augmented data. In block 1430, one or more variations of the sampled augmented data are generated. For example, configuration variables may be used to define the one or more variations. Examples of such variations have been described above with reference to FIGS. 7-13. It should be noted that block 1430 includes generating a plurality of sets of sampled augmented data where each set of sampled data corresponds to a variation in one or more actors and one or more characteristics or behavior. In block 1435, one or more simulation scenarios are generated based on the augmented data and its variations. For example, one simulation scenario may be generated for each set of sampled augmented data. Again, in some implementations, the variations in the simulation scenarios are generated algorithmically. For example, the process starts with a scenario, changes the types of actors, adding/subtracting them, and using different parameters for models that control the actors. The variations of the simulation scenarios can also be generated algorithmically by varying geometry of the world, traffic lights, paint, geometric models of the models, their light, any other properties of the autonomous vehicle's environment. In block 1440, one or more simulations are run using the one or more simulation scenarios.

Figure 15:
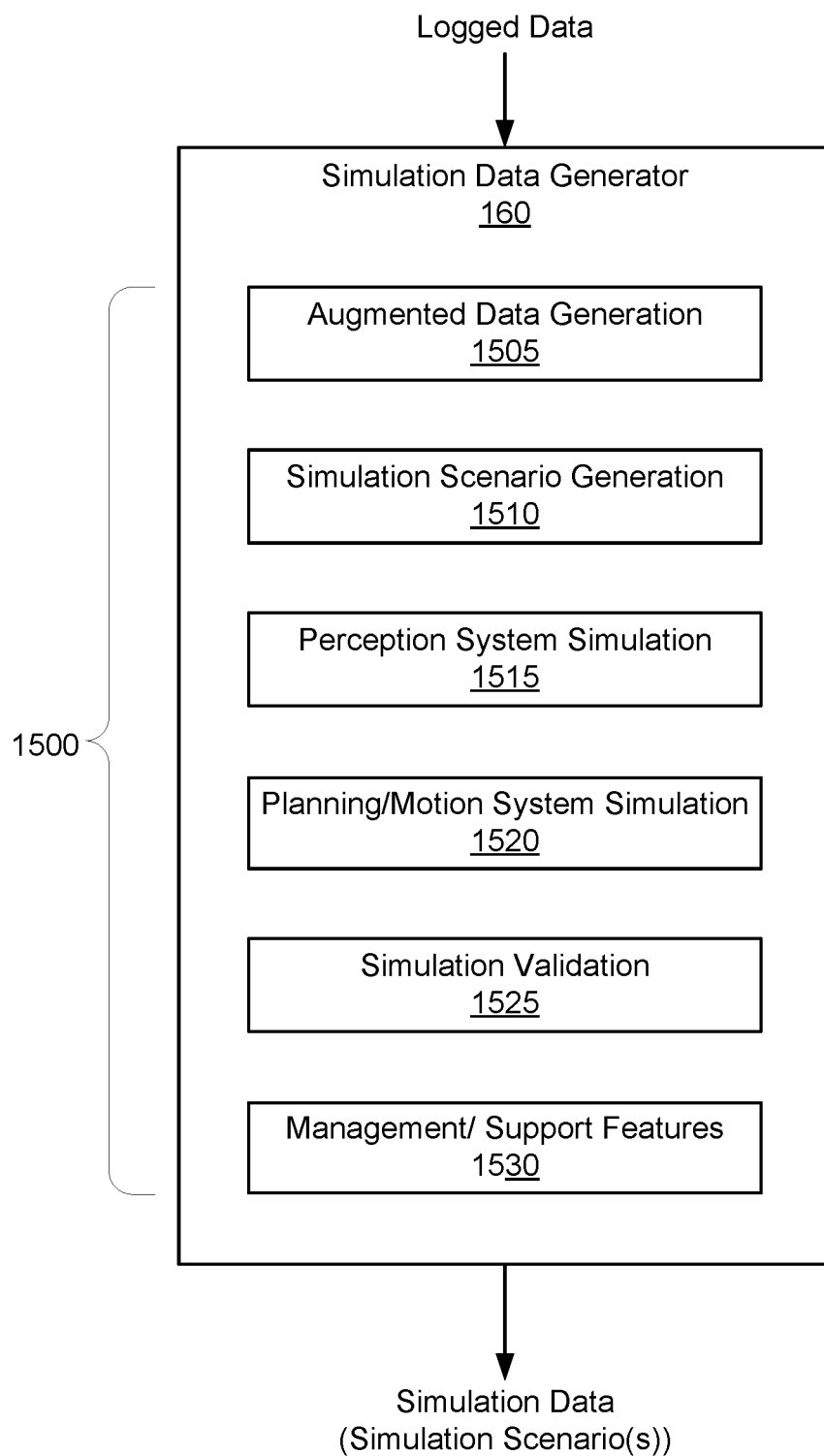
FIG. 15 is a diagram illustrating an example pipeline of the simulation data generator for generating simulation data from logged data according to some implementations.

In some implementations, the simulation data generator 160 is part of a larger pipeline 1500. FIG. 15 illustrates an example of a pipeline 1500 of a simulator data generator 160 in accordance with some implementations. In some implementations, individual modules of the pipeline 1500 may be implemented in software or firmware. In one implementation, an augmented data generation block 1505 performs the data mapping and generation of augmented data. It receives the time-series logged data and generates the augmented data. The augmented data is represented in a global coordinate system using variables interpretable by other entities in the computing system 172.

A simulation scenario generation block 1510 generates simulation scenarios. In some implementations, the scenarios are generated at least in part based on the augmented data. In some implementations, an individual simulation may include a variety of simulation scenarios that describe a set of tests of different specific encounters between an autonomous vehicle 100, its environment, and other actors.

In some implementations, a perception system simulation block 1515 generates configuration information, state information and other information need to simulate the state and operation of the perception system 154 for the selected simulation scenarios. The information generated in this block of the pipeline 1500 is added to the simulation scenarios as appropriate. Likewise, the planning/motion system simulation block 1520 generates configuration information, state information and other information need to simulate the state and operation of the planning/motion system 156 based on outputs of the perception system simulation. This information is also added to the simulation scenarios. In some implementations, a simulation validation block 1525 performs one or more steps to validate the additions to the simulation scenarios to ensure the simulation will execute properly when the simulation scenarios are used for execution by the simulator 208. The pipeline 1500 may also include other management or support features 1530 needed by the simulator 208 to run simulations using the simulation scenarios. Finally, the simulation scenarios are output by the simulation data generator 160 for use by the simulator 208. As noted above, in some implementations, the simulation data generator 160 stores the simulation scenarios as part of the simulation data 212 in the data storage.

Some example methods 1600, 1700, 1800 of using the augmented data will now be described.

Figure 16:
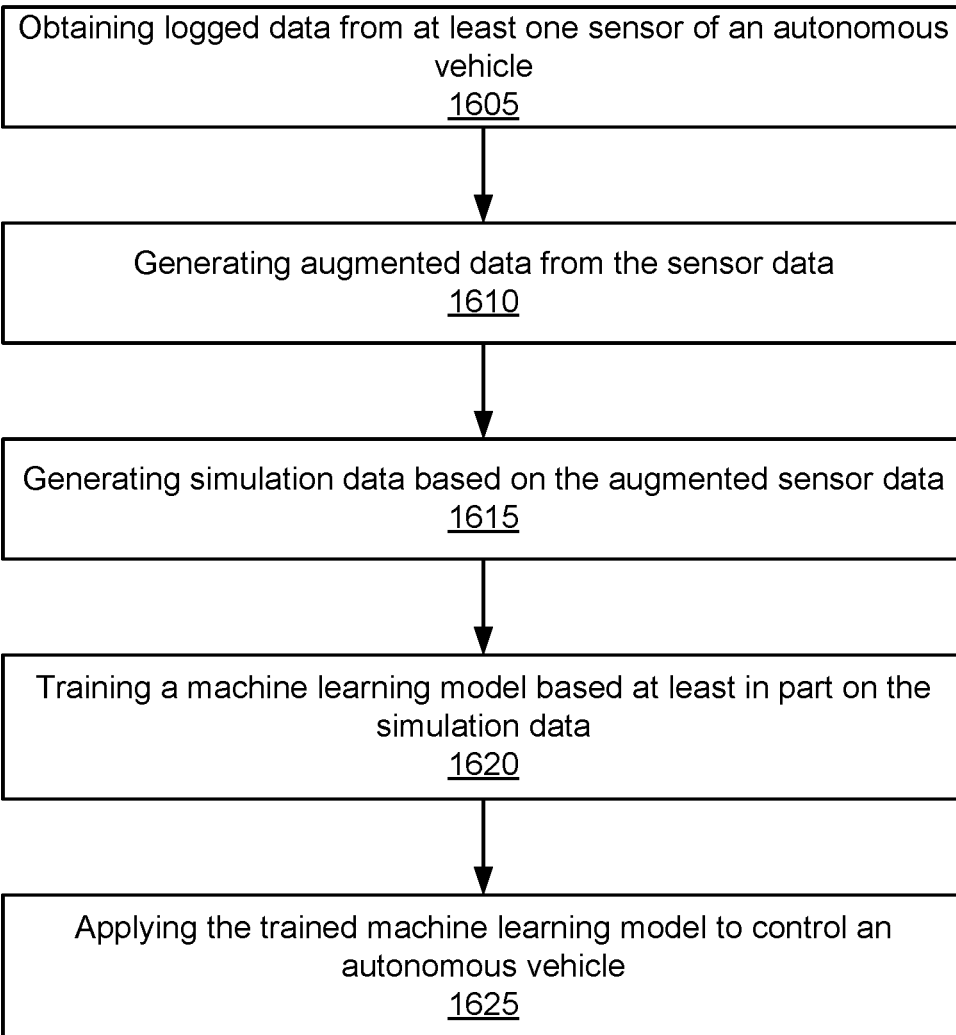
FIG. 16 is a flow chart illustrating a first example method of using simulated data generated from logged data to train a machine learning model according to some implementations.

FIG. 16 is a flow chart illustrating a general method 1600 of using the logged data to train a machine learning model 224 of an autonomous vehicle 100 in accordance with some implementations. In block 1605, logged data including sensor data is obtained from at least one sensor of an autonomous vehicle 100. For example, the logged data may take the form of time-stamped logged data. The logged data may include, for example, localization data and tracking data that is time stamped, although more generally it may also include other vehicle data.

In block 1610, augmented data is generated based on the sensor data. This may include transforming the sensor data into a coordinate system of a simulation and performing data smoothing. This may, in some implementations, include generating metadata or performing formatting to facilitate access and used by other software entities.

In block 1615, simulation data, in particular one or more simulation scenarios, is generated based on the augmented data. Then simulations are executed using one or more simulation scenarios simulation to produce simulation data including simulation results and/or messages.

In block 1620, a machine learning model is trained based at least in part on the simulation data including simulation results and/or messages.

In block 1625, the trained machine learning model is applied to control an autonomous vehicle 100. For example, during operation of the autonomous vehicle 100, the trained machine learning model 224 may be used in a vehicle control system 120.

Figure 17:
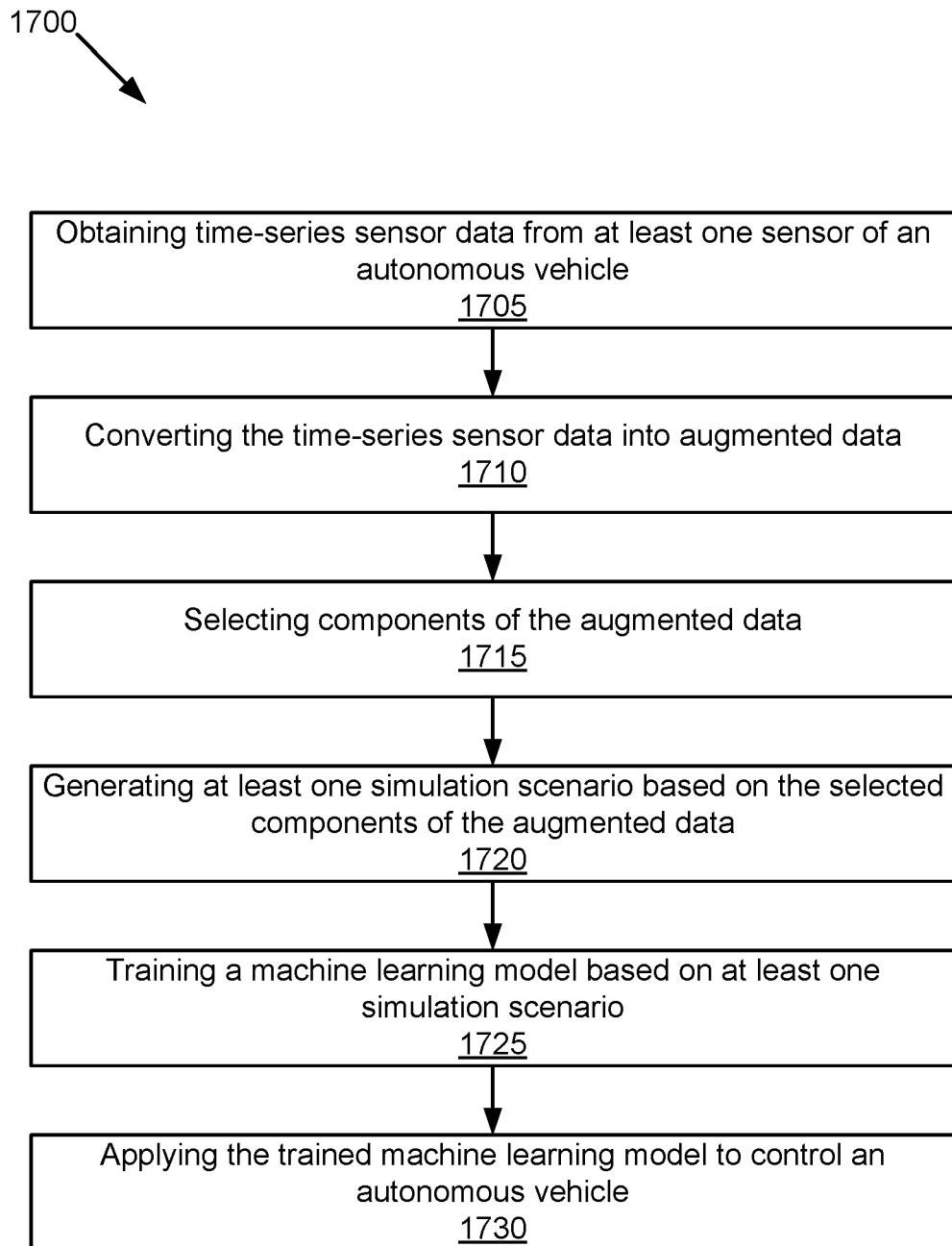
FIG. 17 is a flow chart illustrating a second example method of using simulated data generated from logged data to train a machine learning model according to some implementations.

FIG. 17 is a flowchart illustrating an implementation of a method 1700 for utilizing the logged data 214 to generate simulation scenarios for simulations and generating data used to train a machine learning model 224 of an autonomous vehicle 100. In block 1705, the time-series logged data is obtained from at least one sensor of an autonomous vehicle 100. In block 1710, the time-series sensor data is converted into augmented data 216. In block 1715, components of the augmented data are selected to generate a simulation scenario. For example, actors may be deleted or other components of the augmented data not selected, while other aspects of the data are varied. In block 1715, the selected components of the augmented data 216 are used to generate at least one simulation scenario for use in training the machine learning model 224. The simulation scenario, in turn, may be used by one or more simulators 208 to generate a simulation result. In block 1725, the machine learning model 224 is trained based on a simulation result from a simulation that is based on at least one simulation scenario. In block 1730, the trained machine learning model 224 is applied to control the autonomous vehicle 100.

Figure 18:
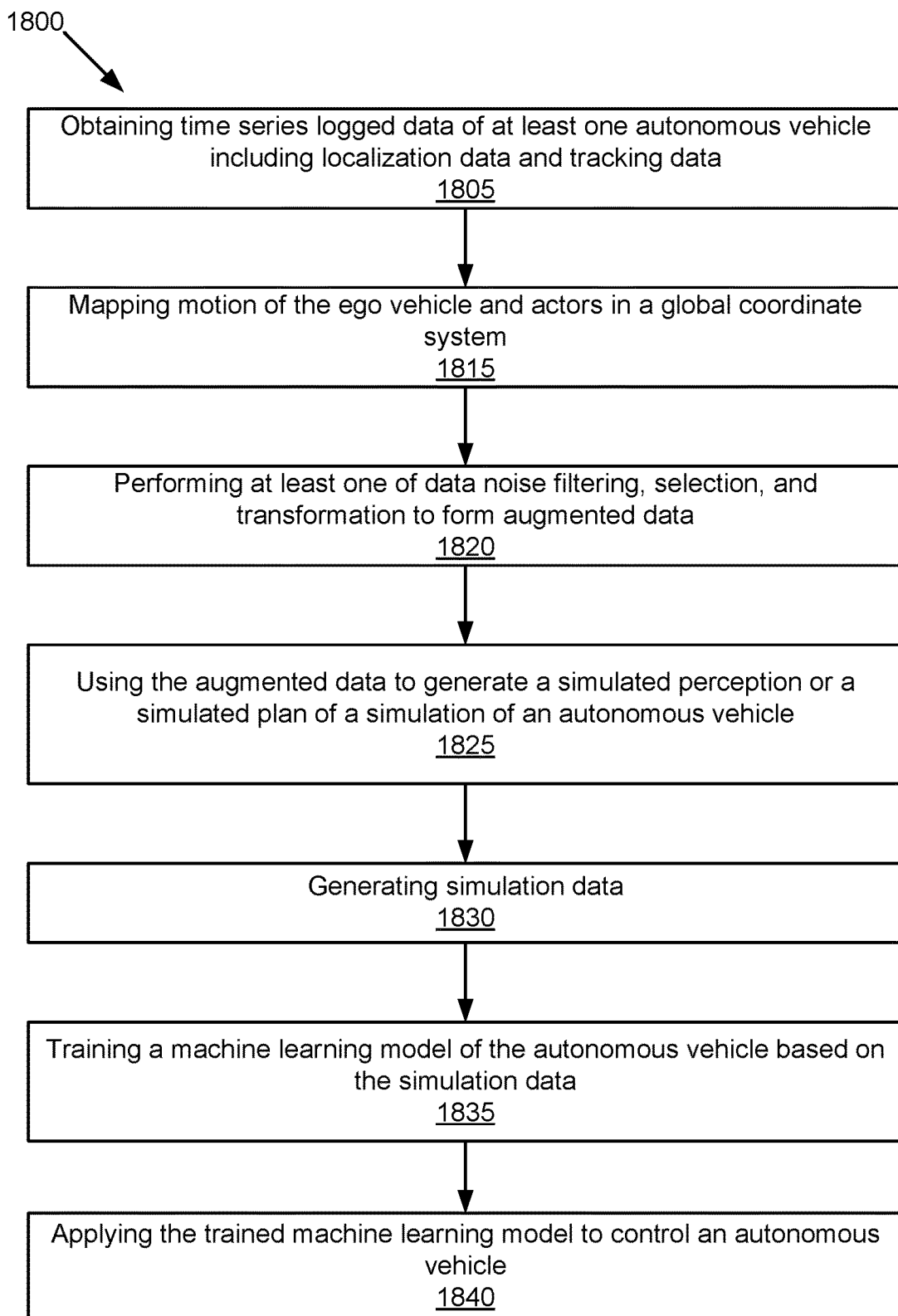
FIG. 18 is a flow chart illustrating a third example method of using simulated data generated from logged data to train a machine learning model according to some implementations.

FIG. 18 is a flow chart illustrating another example of a method 1800 for using simulated data generated from logged data to train a machine learning model according to some implementations. In block 1805, time-series logged data is obtained for at least one autonomous vehicle 100. The time-series logged data includes localization data and tracking data. One or more steps may be taken to transform the time-series logged data into a format that facilitates generating augmented data for use in a simulation. In block 1815, localization data and tracking data are mapped into global coordinates in order to map the motion of the ego-vehicle and actors in the global coordinate system. An example coordinate system is an orthogonal curvilinear coordinate (OCC) system. In one implementation, the actors are fit to a movement model to estimate their movement. In block 1820, at least one of data noise filtering, selection, and transformation is performed. In one implementation, the tracks are smoothed using a smoothing algorithm to make the smoothed tracks closer to ground level truth to form augmented data. In block 1825, the augmented data is used to generate a simulated perception system or a simulated plan for the autonomous vehicle 100. The input may, in some implementations, be a simulation scenario and execution of the simulation scenario to generate a state or condition for the perception subsystem 154 or the planning subsystem 156. However, more generally the input may include simulated sensor data. In block 1830, simulation data is generated by executing the simulation scenario. In block 1835, a machine learning model 224 of the autonomous vehicle 100 is trained based at least in part on the simulation data. In block 1840, the trained machine learning model 224 is applied to control the autonomous vehicle 100.

The previous description is provided to enable practice of the various aspects described herein. Various modifications to these aspects will be understood, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of blocks in the processes disclosed is an example of illustrative approaches. Based upon design preferences, it is understood that the specific order or hierarchy of blocks in the processes may be rearranged while remaining within the scope of the previous description. The accompanying method claims present elements of the various blocks in a sample order, and are not meant to be limited to the specific order or hierarchy presented.

The previous description of the disclosed implementations is provided to enable others to make or use the disclosed subject matter. Various modifications to these implementations will be readily apparent, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the blocks of various examples must be performed in the order presented. As will be appreciated, the order of blocks in the foregoing examples may be performed in any order. Words such as "thereafter," "then," "next," etc. are not intended to limit the order of the blocks; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm blocks described in connection with the examples disclosed herein may be implemented as electronic hardware, computer software, or combinations of both. To clearly illustrate this interchangeability of hardware and software, various illustrative components, blocks, modules, circuits, and blocks have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

In some examples, the functions described may be implemented in hardware, software, firmware, or any combination thereof. If implemented in software, the functions may be stored as one or more instructions or code on a non-transitory computer-readable storage medium or non-transitory processor-readable storage medium. The blocks of a method or algorithm disclosed herein may be implemented in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable others to make or use the present disclosure. Various modifications to these examples will be readily apparent, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for generating simulation data to be used in training a machine learning model for an autonomous vehicle, the method comprising:
   receiving sensor data from one or more sensors of a vehicle;
   generating augmented data from the sensor data, the augmented data describing an actor in an environment of the vehicle;
   generating a variation of the augmented data; and
   generating a simulation scenario, the simulation scenario generated using the variation of the augmented data.

2. The method of claim 1, wherein generating the variation of the augmented data includes changing one or more actor characteristics associated with the actor.

3. The method of claim 1, wherein the actor is associated with an actor characteristic, and the actor characteristic includes one from a group of actor velocity, actor type, actor size, actor geometric shape, actor reflectivity, actor color, actor path, lateral offset of motion of the actor, longitudinal offset of motion of the actor, and actor behavior response.

4. The method of claim 1, wherein the generating a variation of the augmented data includes deleting the actor, adding an additional actor, or both.

5. The method of claim 1, wherein generating the variation of the augmented data comprises:
   generating a set of augmented data samples; and
   wherein the generating the simulation scenario using the variation of the augmented data includes generating the simulation scenario from the set of augmented data samples.

6. The method of claim 1, wherein generating the variation of the augmented data includes generating a plurality of sets of augmented data samples, and wherein generating the simulation scenario using the variation of the augmented data includes generating a plurality of simulation scenarios each one corresponding to one set of the plurality of sets of augmented data samples.

7. The method of claim 1, further comprising:
   executing a simulation based on the simulation scenario to generate a simulated output;
   providing the simulation scenario as a training input to the machine learning model to generate a predicted output of the machine learning model; and
   updating the machine learning model based on a difference between the predicted output and the simulated output of the simulation scenario.

8. The method of claim 1, wherein the simulation scenario describes motion behavior of a simulated vehicle and at least one simulated actor.

9. The method of claim 1, wherein the actor includes one from a group of another vehicle, a bicycle, a scooter, traffic, a pedestrian, an animal, machinery, debris, a static object, and a non-human moveable object.

10. A system comprising one or more processors and memory operably coupled with the one or more processors, wherein the memory stores instructions that, in response to execution of the instructions by the one or more processors, cause the one or more processors to perform operations comprising:
    receiving sensor data from a sensor of a vehicle;
    generating augmented data from the sensor data, the augmented data describing an actor in an environment of the vehicle;
    generating a variation of the augmented data; and
    generating a simulation scenario, the simulation scenario generated using the variation of the augmented data.

11. The system of claim 10, wherein generating the variation of the augmented data includes changing one or more actor characteristics associated with the actor.

12. The system of claim 10, wherein the actor is associated with an actor characteristic, and the actor characteristic includes one from a group of actor velocity, actor type, actor size, actor geometric shape, actor reflectivity, actor color, actor path, lateral offset of motion of the actor, longitudinal offset of motion, and actor behavior response.

13. The system of claim 10, wherein the generating the variation of the augmented data includes deleting the actor, adding an additional actor, or both.

14. The system of claim 10, wherein generating the variation of the augmented data comprises:
  generating a set of augmented data samples; and
  wherein the generating the simulation scenario using the variation of the augmented data includes generating the simulation scenario from the set of augmented data samples.

15. The system of claim 10, wherein generating the variation of the augmented data includes generating a plurality of sets of augmented data samples, and wherein generating the simulation scenario using the variation of the augmented data includes generating a plurality of simulation scenarios each one corresponding to one set of the plurality of sets of augmented data samples.

16. The system of claim 10, wherein the operations further comprise:
  executing a simulation based on the simulation scenario to generate a simulated output;
  providing the simulation scenario as a training input to a machine learning model to generate a predicted output of the machine learning model; and
  updating one or more weights in the machine learning model based on a difference between the predicted output and the simulated output of the simulation scenario.

17. The system of claim 10, wherein the actor includes one from a group of another vehicle, a bicycle, a scooter, traffic, a pedestrian, an animal, machinery, a static object, and a non-human moveable object.

18. The system of claim 10, wherein the simulation scenario describes motion behavior of a simulated vehicle and at least one simulated actor.

19. A non-transitory computer readable storage medium storing computer instructions executable by one or more processors to perform a method of generating simulation data for an autonomous vehicle, the method comprising:
  receiving sensor data from one or more sensors of a vehicle;
  generating augmented data from the sensor data, the augmented data describing an actor in an environment of the vehicle;
  generating a variation of the augmented data; and
  generating a simulation scenario, the simulation scenario generated using the variation of the augmented data.

20. The non-transitory computer readable storage medium of claim 19, wherein generating the variation of the augmented data comprises:
  generating a set of augmented data samples; and
  wherein the generating the simulation scenario using the variation of the augmented data includes generating the simulation scenario from the set of augmented data samples.

* * * * *